United States Patent [19]

Tamura et al.

[11] Patent Number: 5,565,702
[45] Date of Patent: Oct. 15, 1996

[54] ANTIFUSE ELEMENT, SEMICONDUCTOR DEVICE HAVING ANTIFUSE ELEMENTS, AND METHOD FOR MANUFACTURING THE SAME

[75] Inventors: Yoshimitsu Tamura; Hiroshi Shinriki; Tomohiro Ohta, all of Chiba, Japan

[73] Assignee: Kawasaki Steel Corporation, Kobe, Japan

[21] Appl. No.: 353,296

[22] Filed: Dec. 5, 1994

[30] Foreign Application Priority Data

Aug. 19, 1994 [JP] Japan .................................. 6-195690
Sep. 29, 1994 [JP] Japan .................................. 6-235058

[51] Int. Cl.$^6$ .......................... H01L 29/04; H01L 27/10; H01L 29/00
[52] U.S. Cl. .......................... 257/530; 257/50; 257/528; 257/209
[58] Field of Search .......................... 257/50, 529, 528, 257/530, 52

[56] References Cited

U.S. PATENT DOCUMENTS 4,488,262  12/1984  Basire et al. .
5,166,556  11/1992  Hsu et al. .
5,404,029   4/1995  Husher et al. .

*Primary Examiner*—Sara W. Crane
*Assistant Examiner*—Valencia Martin Wallace
*Attorney, Agent, or Firm*—Oliff & Berridge

[57] ABSTRACT

An antifuse element provided on a semiconductor device comprises a bottom electrode, an antifuse material layer, and a top electrode. At least the uppermost portion of the bottom electrode is made of metallic silicide in which the metal composition ratio is set to greater than the stoichiometry composition ratio. The metallic silicide is obtained by silicidizing the metal at a temperature of 400°–700° C. The crystal orientation of the thus formed metallic silicide is at random, and therefore the surface of the bottom electrode made of metallic silicide becomes flatter and smoother. The metal component of the metallic silicide is effectively used in the forming of the filament when a breakdown voltage is applied to the selected electrodes for an electrical connection.

17 Claims, 18 Drawing Sheets

ANTIFUSE ELEMENT, SEMICONDUCTOR DEVICE HAVING ANTIFUSE ELEMENTS, AND METHOD FOR MANUFACTURING THE SAME

BACKGROUND OF THE INVENTION

1. Field of the Invention

This invention relates to an antifuse element provided on a semiconductor device which is used for, for example, a field programmable gate array (FPGA) or programmable read only memory (PROM) constituted as an integrated circuit.

2. Description of the Related Art

A semiconductor device used for a FPGA (which is a gate array programmable by a user) or PROM is generally provided with antifuse elements which comprise a bottom electrode, an antifuse material layer, and a top layer electrode, as is described in IEEE, Electron Device Letter, Vol. 12, No. 4, April 1991 pp. 151–153, and IEEE, IEDM Tech.Dig 1993 pp. 31–34.

In such an antifuse element, an antifuse material insulating film is formed within a through hole between the bottom and top electrodes, and at a selected antifuse element, the antifuse material film is broken down to form a filament for electrical connection between the bottom and top electrodes. In order to break the antifuse material film, a relatively high breakdown voltage is applied to the selected antifuse element between the bottom and top electrodes. By employing this type of antifuse element, desired programming is easily achieved by a user for FPGA because antifuse elements to be connected are arbitrarily selected after forming metal interconnects to provide conductivity between the bottom and top electrodes. Similarly, desired data writing is allowed for PROM after forming the metal interconnects.

However, there are still some problems in such conventional antifuse elements.

First, the bottom electrode of the conventional antifuse element described in the above publication is made of TiN which also functions as a barrier metal. The TiN has a column crystalline structure and the resultant electrode has sharp protrusions on its surface. That is, the surface of the conventional bottom electrode is rough and uneven. When forming a very thin antifuse material film having a thickness of several ten nm on the rugged surface, the electric field for breaking down the antifuse material film is concentrated to the protrudent portions, and the breakdown condition of the antifuse material film differs among the antifuse elements or differs among the area even in the same through hole. As a result, variations are caused in the cross sectional area of the filaments which are formed by the breakage of the antifuse material film, which further causes variations in ON resistance when the operation voltage is applied between the bottom and top electrode, and results in variations in the extent of the delay of the interconnect wiring. Consequently, the program reading speed for RPGA and the data reading speed for PROM are also varied. More particularly, the filament formed on the surface having sharp protrusions has a smaller cross section, and naturally, the ON resistance during the application of the operation voltage becomes high. Moreover, the filament in the conventional antifuse element is formed by a compound containing not only titanium (Ti) but also nitrogen (N) from the bottom electrode as well as sillicon (Si) from the insulating film, and the resistance of the filament itself becomes high. Such high resistance causes a large delay in the wiring, and consequently, the reading speed of the program or data is reduced.

Second, electrical connection must be ensured between the top and bottom electrode when the antifuse material film is broken down, while insulation must be ensured where no breakdown occurs. For this reason, in the conventional antifuse elements, it was necessary to make the antifuse material film thicker, including margin thickness for reliable insulation, due to the large surface roughness of the bottom electrode. This causes the breakdown voltage to be raised. However, in view of the fact that an integrated circuit becomes more and more dense, the operation voltage of the IC must be reduced. Therefore, in order to provide a high breakdown voltage for break downing the antifuse material film, separate means, such as a booster, is required.

SUMMARY OF THE INVENTION

This invention was conceived for overcoming the above described problems, and it is an object of the invention to provide an antifuse element for a semiconductor device in which the surface of the bottom electrode is even and flat, and the resistance of the filament itself and the variation in the ON resistance of the filament are greatly reduced. By providing such an antifuse element, reliability of the circuit operation is improved as well as the operation rate of the circuit is raised.

It is another object of the invention to provide an antifuse element for a semiconductor device in which both the electrical connection and insulation between the top and bottom electrodes are ensured, and both the breakdown voltage and the operation voltage can be set low.

It is still another object to provide a method for a manufacturing the above described antifuse element for a semiconductor device.

In order to achieve these objects, at least the uppermost surface of the bottom electrode is made of a metallic silicide in which the composition ratio of the metal is set greater than the stoichiometry composition ratio. Such metallic silicide having a higher metal composition ratio is formed by annealing a metal film formed on the silicon substrate at a lower temperature than the conventional method (i.e. at 400°–700° C.). The metal is selected from among the group of Ti, Ta, Nb, Zr, Y, Hf, Al, W, Mo, Cr, V, Mn, Fe, Co, Ni, Pd and Pt, and the resultant metallic silicide consists of one of the above metals and Si. The crystal orientation of the thus formed metallic silicide is at random (that is, the crystal growth is at random), and therefore, the surface of the bottom electrode becomes much smoother than the conventional one. The antifuse material layer formed on the flat surface is also even and uniform, and thus, the quality of the antifuse material layer is improved. The breakdown voltage applied to the uniform antifuse material layer also becomes constant (which means that the breakdown of the insulation is caused by the constant electric field), and variations in the cross sectional area of the filament are greatly reduced. Furthermore, since the concentration of the electric field to a particular portion of the antifuse material layer is prevented, the uniform cross section of the filament is enlarged, thereby reducing the resistance of the filament itself.

The metal ratio of the bottom electrode made of metallic silicide is set to higher than the stoichiometry composition ratio so that a sufficient amount of the metal is taken in the filament passage. In other words, the filament is formed of a compound containing a sufficient ratio of the metal. The resistivity of the above described group of metals (i.e. Ti, W, etc.) is smaller than that of Si, and therefore, resistance of the filament is reduced. Especially, among the above group, a metal having a high melting point, such as Ti and W, has a small self diffusing coefficient, and when using these metal, the electro-migration (EM) endurance of the filament is improved.

Since the metallic silicide, such as titanium silicide, is formed at the temperature below 700° C., the diffusing speed of both Si and the metal (Ti) is reduced and the crystal growth rate is restrained. As a result, the resultant metallic silicide (titanium silicide) is constituted by minute crystal and is almost amorphous. More particularly, the diameter of the crystal is less than 20 nm, and thus, the evenness of the surface of the bottom electrode is improved. The extent of the evenness is represented as a center line average height Ra, and when employing this unit, Ra can be set to less than 2.0 nm. Alternately, the solid angle is also used for the indication of the evenness, and when using this parameter, the solid angle of the crystal having a size 1 nm–1 μm can be set to $1.8\pi$–$2.0\pi$.

Titanium silicide obtained by the silicidation at a temperature below 700° C. is metastable, and the composition ratio of Ti can be made greater than the stoichiometry composition ratio. In other words, by merely lowering the silicidation temperature below the crystallization temperature, titanium silicide having a flatter surface and higher titanium ratio can be obtained. This principle can be equally applied to any other metal included in the above described group. When the silicidation temperature is under 400° C., the composition ratio of Ti becomes too high, that is, the amount of Ti is more than three times the Si ratio. In such a case, a column crystalline structure of Ti becomes dominant, and evenness can not be obtained.

In the antifuse element according to the invention, at least the lowermost portion of the top electrode is made of titanium silicide in which the amount of titanium is 40% or more. The top electrode may be made of titanium nitride in which the amount of titanium is 55% or more. In either case, the composition ratio of titanium is greater than the stoichiometry composition ratio, and a lot of titanium can be used in the forming of the filament.

In the present invention, a negative voltage is applied to the bottom electrode, while a positive voltage is applied to the top electrode. Accordingly, the filament formed by break downing the antifuse material layer with the breakdown voltage contains a lot of metal component from the bottom electrode (metallic silicide). Thus, when the voltage is applied between the top and bottom electrodes to break down the antifuse material layer (i.e. when the circuit is programmed), a large electron stream flows from the bottom electrode to the top electrode (i.e. a high current density is generated). Along with this electron stream, the metal of the bottom electrode also flows to the filament. Thus, the composition ratio of the metal is increased in the filament, and the resistance of the filament is reduced. Especially when the metal in metallic silicide has a high EM endurance property, the EM endurance of the filament is also improved.

In another aspect of the invention, a method for manufacturing an antifuse element for a semiconductor device is provided. This method comprises the steps of (1) forming a bottom electrode of the antifuse element, at least an upper most portion of the bottom electrode being made of metallic silicide in which the composition ratio of the metal is greater than the stoichiometry composition ratio, (2) forming a dielectric layer over the bottom electrode, (3) forming an antifuse connecting hole, and removing an oxide or nitride which has been naturally formed on the metallic silicide and further removing a portion of the metallic silicide from its surface and extending in the depth direction while allowing a new natural oxide layer to be formed therein, (4) forming an antifuse material layer containing the new oxide layer on the bottom electrode, and (5) forming a top electrode on the antifuse material layer to complete the antifuse element. In the step for removing a portion of the metallic silicide while forming the new oxide layers, a wet etching technique is employed using an ammonia hydrogen peroxide solution.

In the thus formed antifuse element for semiconductor device, coarse oxide or nitride formed on the bottom electrode and having sharp protrusions is removed to make the surface even. Further, by removing a portion of the surface of the bottom electrode, the evenness is enhanced. By employing the wet processing using the ammonia hydrogen peroxide solution, a new flat and superior oxide layer can be formed during the removal of a portion of the surface of the bottom electrode. Thus, the even and fine quality antifuse material layer can be formed on the bottom electrode.

DESCRIPTION OF THE PREFERRED EMBODIMENT

Figure 1A:
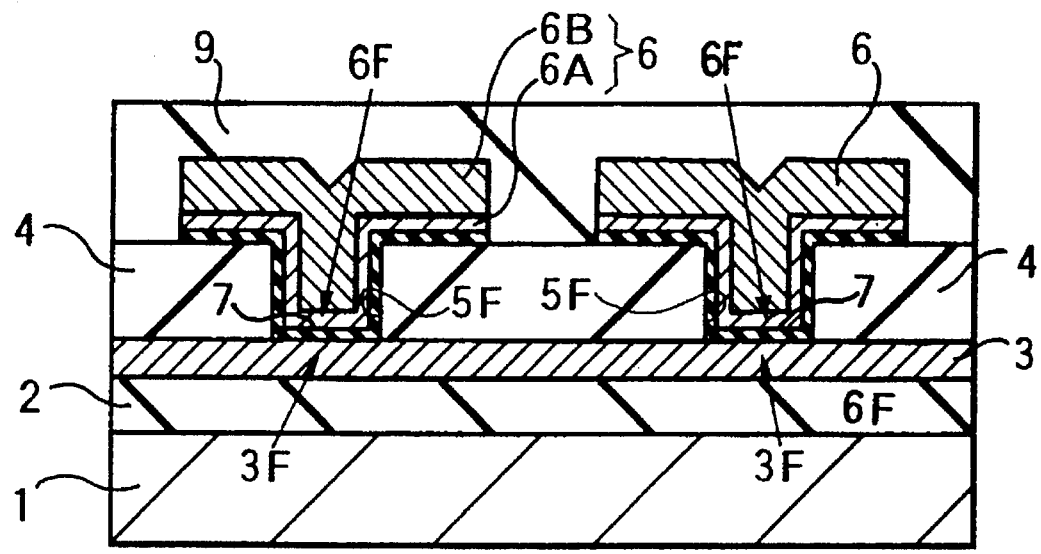
FIG. 1A is a cross-sectional view of the antifuse elements prior to programming, according to the first embodiment of the invention.

FIG. 1A shows antifuse elements provided in a semiconductor device prior to programming. In this embodiment, a plurality of the antifuse elements are formed in the semiconductor device. Such a semiconductor device is used for FPGA or PROM, which is formed as an integrated circuit. As is shown in FIG. 1A, metal interconnects are constructed on the semiconductor substrate 1, such as, for example, single crystalline silicon substrate. On the top surface of the substrate 1, semiconductor elements (not shown) such as MISFETs (Metal Insulator Semiconductor Field Effect Transistor) are arranged to constitute the FPGA or PROM.

In this embodiment, the metal interconnect has a two-layer structure consisting of first level (lower) metal interconnect 3 and second level (upper) metal interconnect 6. The first level metal interconnect 3 is formed on the dielectric layer 2 covering the semiconductor elements, and comprises a plurality of conductor strip arranged in parallel. The second level metal interconnect layer 6 is formed on the dielectric layer 4 which is formed on the first level metal interconnect layer 3, and comprises a plurality of conductor strips arranged in parallel in the direction perpendicular to the conductor strips of the first level metal interconnect 3. The first level and second level metal interconnects 3 and 6 are electrically connected to each other via through holes formed in the dielectric layer 4, and are used for inter-circuit wiring, such as a wiring between the logic circuits.

Antifuse elements are incorporated in the inter-circuit wiring, and are selectable by users to decide how to connect the circuits. The antifuse element comprises a bottom electrode 3F, an antifuse material layer 7, and a top electrode 6F. In this embodiment, the bottom electrode 3F is formed in the first level metal interconnect 3 during the process of forming the metal interconnect 3. The top electrode 6F is formed in the second level interconnect 6 during the process of forming the metal interconnect 6. The antifuse material layer 7 is formed within the antifuse connecting hole 5F between the bottom electrode 3F and the top electrode 6F. The antifuse connecting hole 5F is formed in the process of forming the interconnect through holes.

In this invention, at least an uppermost portion of the bottom electrode 3F, which directly contacts the antifuse material layer 7, is made of a metallic silicide in which the ratio of metal to silicon is set to greater than the stoichiometry composition ratio. Such a metallic silicide is formed by Si and one of the group of Ti, Ta, Nb, Zr, Y, Hf, Al, W, Mo, Cr, V, Mn, Fe, Co, Ni, Pd, and Pt. In this embodiment, a single layer of titanium silicide is used for the bottom electrode 3F. In the titanium silicide, the ratio of Ti to Si is greater than the stoichiometry composition ratio, but not more than three times. In such a titanium silicide, the crystal orientation is random (i.e. the crystal grows in random directions), and the sharp protrusions are prevented from being generated on the surface of the resultant electrode 3F. When the composition ratio of titanium is greater than 3, the column crystalline property of Ti exceeds the random crystal growth, and the evenness of the surface of the bottom electrode 3F can no longer be ensured.

Moreover, since titanium has a high melting point and a low self diffusing coefficient, the titanium silicide also has a superior EM endurance and a small resistivity as well as high stability. Accordingly, high reliability can be maintained in the manufacturing process of the semiconductor device.

In the antifuse elements shown in FIG. 1A, there exists an antifuse material layer 7 between the bottom electrode 3F and the top electrode 6F, and therefore, no electrical connection yet exists (non-conductive state). In other words, programming has not yet been carried out for the FPGA, and data writing has not yet been performed for PROM.

Figure 1B:
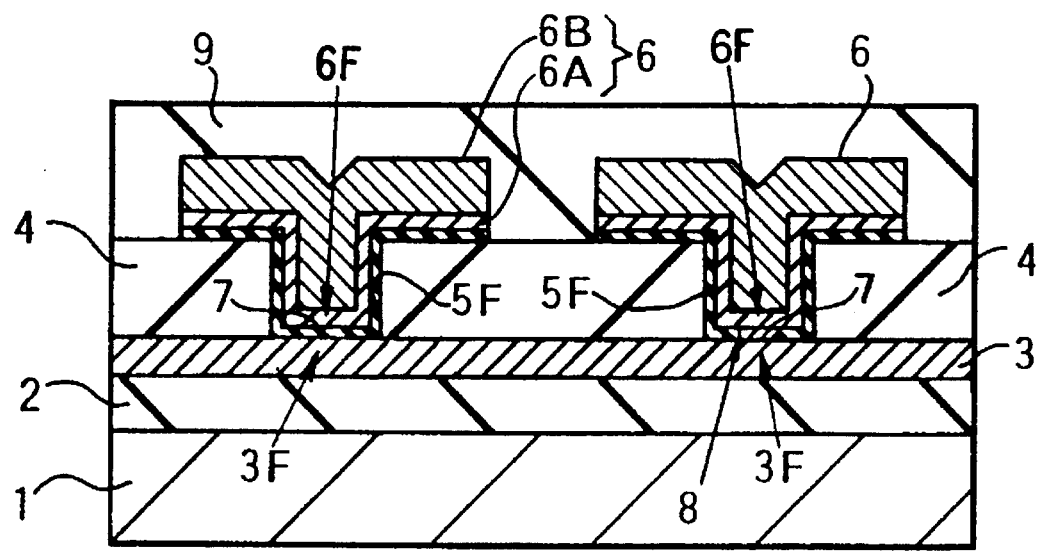
FIG. 1B is a cross-sectional view of the antifuse elements after programming.

When the antifuse material layer 7 is broken down at a selected antifuse element as is shown in FIG. 1B (in the figure, the right side antifuse element), the filament 8 is formed between the bottom electrode 3F and the top electrode 6F. That is, programming has been carried out for the FPGA, and data writing has been performed for PROM. A final passivation layer 9 is formed on the second metal interconnect layer 6.

The method for manufacturing the antifuse element for the semiconductor device will now be described with reference to FIGS. 2A–2D.

Figure 2A:
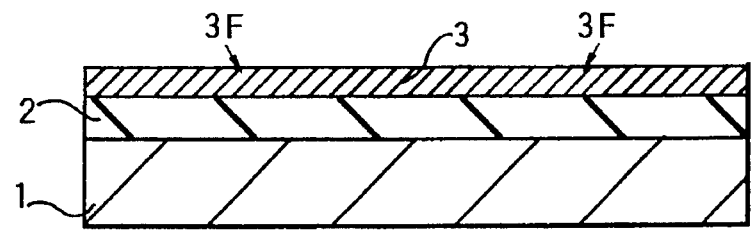
FIGS. 2A, 2B, 2C and 2D show the fabrication process steps of the antifuse elements of FIG. 1A.

First, as is shown in FIG. 2A, the first level metal interconnect 3 consisting of a plurality of conductor strips is formed on the dielectric layer 2, and in the same fabricating process, the bottom electrode 3F is formed in a part of the metal interconnect 3. In this embodiment, the metal interconnect 3 and the bottom electrode 3F are composed of composite layers of a polycrystalline silicon layer and an uppermost titanium silicide layer. The uppermost titanium silicide layer is formed by successively depositing polycrystalline Si film and Ti film, and by subjecting them to silicidation processing. The polycrystalline Si film is deposited by sputtering or a CVD technique so as to have a thickness of 200 nm. The Ti film is also deposited by sputtering or a CVD technique so as to have a thickness of 40 nm. The silicidation is performed by rapid thermal annealing to form titanium silicide from the polycrystalline Si film and Ti film. The deposited Si film and Ti film are heated at a lower temperature than in the conventional method, that is, at 400°–700° C. In this embodiment, the silicidation is carried out at 600° C. for 10–100 seconds under the nitrogen atmosphere. When the silicidation is carried out at such a lower temperature, the diffusing speed of both Si and Ti is decreased, and the crystal growth speed is reduced. As a result, the resultant titanium silicide consists of very minute crystals, or has an amorphous structure. This means that the surface of the bottom electrode 3F becomes flatter and smoother without sharp protrusions. Moreover, by the silicidation at a lower temperature, the diffusion of Si governs the crystal growth, and the resultant metallic silicide contains a higher metal component than the disilicide ($MSi_2$: a metallic silicide having a most stable stoichiometry composition ratio).

Figure 3A:
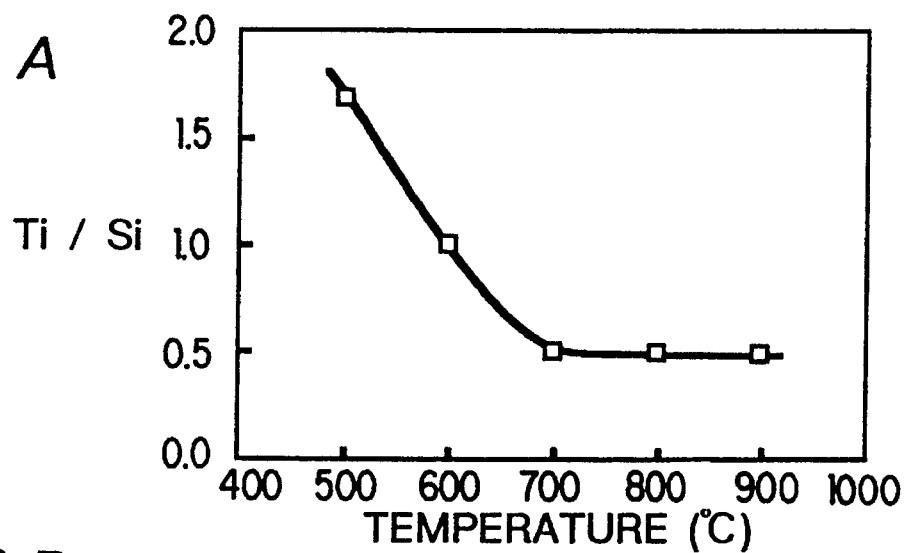
FIG. 3A is a chart of the composition ratio of the titanium silicide vs. silicidation temperature.

The relationship between the silicidation temperature and the composition ratio of the titanium silicide (Ti/Si) is shown in FIG. 3A. When the silicidation temperature is greater than 700° C., the resultant titanium silicide is stable with the stoichiometry composition ratio. At the temperature below 700° C., the ratio of Ti to Si becomes greater than the stoichiometry composition ratio. When the temperature is below 400° C., the Ti containing percentage reaches about three times that of the Si containing percentage, and in the resultant titanium silicide, the crystal structure of Ti becomes superior (which means the column crystal structure become dominant). In such a case, sharp protrusions are generated on the surface of the bottom electrode 3F.

The titanium silicide electrode 3F (metal interconnect 3) may be formed by sputtering, as well as by the thermal annealing. In this case, the substrate temperature is set to 200° C. and target material is used with the composition ratio of Ti to Si being 1:1. The composition ratio of the titanium silicide layer formed on the 200° C. substrate by sputtering is substantially the same as that of the target material. In this method, the annealing process at a temperature higher than 700° C. is omitted, and therefore, the resultant metallic silicide consists of more minute crystal grains, or is in an amorphous state.

The bottom electrode 3F may be made of tungsten silicide, which can be formed by either sputtering or a CVD technique. If the CVD technique is used, the conditions are set as follows. Substrate temperature is set to 250° C., the composition ratio of the source gas is $WF_6:SiH_4=1:4$, gas pressure is 0.5 torr, gas flow 300 sccm. Under these conditions, the tungsten containing percentage is about twice the Si percentage. By omitting the annealing process at a temperature higher than 700° C., the surface of the tungsten silicide is made even and flat.

The titanium silicide is then patterned to complete the bottom electrode 3F as well as the first level metal interconnect.

Figure 2B:
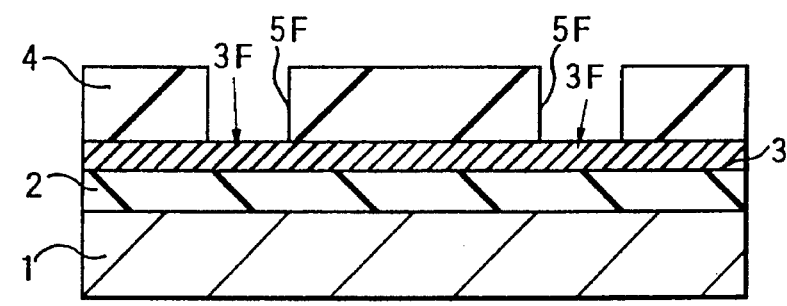

Next, as shown in FIG. 2B, the dielectric layer 4 is formed on the first level metal interconnect 3, and an antifuse connecting hole 5F is formed in the dielectric layer 4 at a position corresponding to the bottom electrode 3F. The dielectric layer 4 is made of, for example, silicon oxide having a thickness of 1.0 µm. The antifuse connecting hole 5F is formed by a photolithographic process and etching so as to have a diameter of 1.0 µm, for example.

Then, within the antifuse connecting hole 5F, the wet processing is provided to the surface of the titanium silicide bottom electrode 3F for the purpose of removing the natural oxide or nitride formed on the surface of the titanium silicide during the silicidation process, and of further removing a portion of the titanium silicide from its surface in the depth direction. In this embodiment, 70° C. ammonia hydrogen peroxide solution ($NH_4OH: H_2O_2: H_2O=1:1:5$) is used for the wet processing (i.e. APM cleaning). The wet processing is carried out for 5 minutes to enhance the evenness and smoothness of the surface of the bottom electrode 3F. Under the above described conditions (solution temperature: 70° C., processing time: 5 minute), the etching amount of the titanium silicide is 5–10 nm. Since the etching rate of the wet processing under these conditions is relatively slow, the etching amount is correctly controlled and the titanium silicide required for at least the uppermost portion of the bottom electrode 3F is prevented from being etched too much. In the embodiment, the thickness of the titanium silicide after being subjected to the etching is 40 nm, and this thickness is ensured by the above conditioned wet etching.

Isotropic chemical dry etching using a fluoride gas may be used for the removing process. As isotropic chemical etching, non-plasma etching using $ClF_3$ gas ($ClF_3$ cleaning) or using $F_2$ gas ($F_2$ cleaning) may be employed. When using the $ClF_3$ gas, the etching is carried out under the following conditions. Ar: $ClF_3$=9: 1, gas pressure: 100 torr, etching time: 1 minute. When using the $F_2$ gas, the etching conditions are as follows. $F_2$: He =3: 97, gas flow: 1,000 sccm, gas pressure: 1.0 torr, substrate temperature: 200° C., etching time: 3 minutes.

Alternatively, plasma etching may be used for the isotropic chemical etching, such as one using $NF_3$ gas ($NF_3$ cleaning), $BCl_3$ gas ($BCl_3$ cleaning), or mixed gas of $CF_4$ and $O_2$ ($CF_4$ cleaning). When using the $BCl_3$ gas, the etching conditions are as follows. $BCl_3$: Ar =4 : 1, gas flow: 100 sccm, gas pressure: 1.0 torr, high frequency output: 13.56 MHz, substrate temperature: 200° C., etching time: 3 minutes. When using the mixed gas, the etching condition is as follows. $CF_4: O_2$=8: 2, gas flow: 100 sccm, gas pressure: 0.1 torr, high frequency: 13.56 MHz, substrate temperature: 30° C., etching time: 2 minutes. Another fluoride gas, such as $CF_4$, $C_2F_6$, $CH_2F_2$, $CH_3F$ or $SF_6$, may be used for the isotropic chemical dry etching.

Figure 2C:
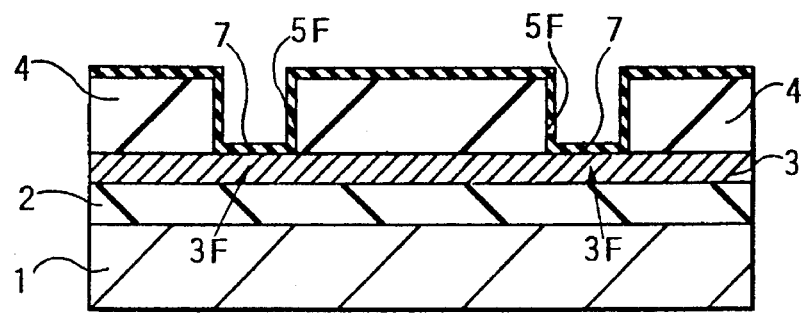

Next, the antifuse material layer 7 is formed at least on the bottom electrode 3F within the antifuse connecting hole 5F. In the embodiment, as is shown in FIG. 2C, the antifuse material layer 7 is formed on the bottom electrode 3F, the side wall of the connecting hole 5F and all over the dielectric layer 4. The antifuse material layer 7 is made of silicon nitride which is deposited under the following conditions. Substrate temperature: 350° C., $SiH_4$ capacity: 1700 sccm, $NH_3$ capacity: 500 sccm, $N_2$ capacity: 300 sccm, pressure: 0.35 torr, high frequency: 50 KHz, high frequency output: 0.98 KW. The antifuse material layer 7 has a thickness 5–20 nm, and in the embodiment, 10 nm of the antifuse material layer is formed. Since the surface of the bottom electrode 3F is even and smooth, the uniform and fine quality antifuse material layer can be formed on the bottom electrode in the antifuse connecting hole 5F.

The antifuse material layer 7 may be made of a single layer of silicon oxide or tantalum oxide, or composite layers of any combination of silicon nitride, silicon oxide and tantalum oxide.

In the case that the antifuse material layer forming process is carried out in the same vacuum chamber as the dry etching of the titanium silicide (i.e. bottom electrode 3F), the possibility that the natural oxide film is formed on the surface of the bottom electrode 3F is substantially reduced, and the fine quality of antifuse material layer 7 is formed directly on the surface of the bottom electrode which has been evened by dry etching. On the other hand, if these two processes are not carried out in the same vacuum chamber (that is, if exposure to the atmosphere occurs), the natural oxide film is formed on the surface of the bottom electrode 3F. However, such a natural oxide film formed on the even and smooth surface is not a serious problem, and fine quality of the antifuse material layer 7 is maintained even if formed on the natural oxide film.

Figure 2D:
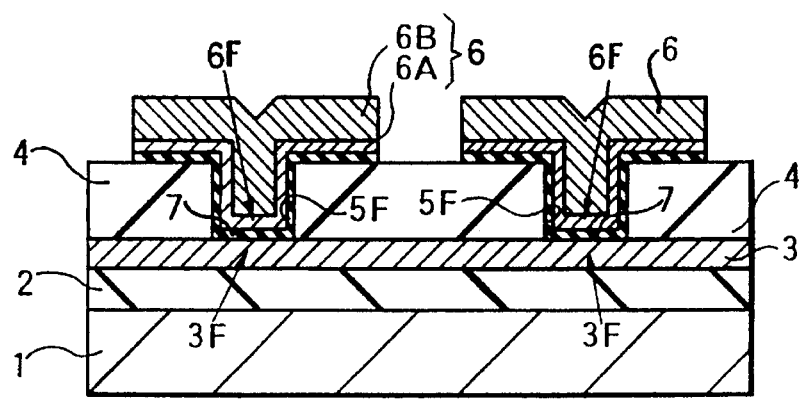

Finally, as is shown in FIG. 2D, the second level metal interconnect 6 is formed on the antifuse material layer 7 covering the dielectric layer 4, and in the same fabricating process, the top electrode 6F is formed at the position corresponding to the bottom electrode. In the embodiment, the top electrode 6F and the second level metal interconnect 6 are formed in a two-layer structure, where the titanium nitride layer 6A and the aluminum alloy layer 6B are successively deposited.

The lower titanium nitride 6A is deposited by reactive sputtering or a CVD technique to a thickness of 10 nm. The titanium ratio of the titanium nitride 6A is set to greater than the stoichiometry composition ratio, for example, the Ti containing ratio is 55% or more. When using reactive sputtering, the titanium nitride 6A is deposited by using a titanium target material under the following conditions. Substrate temperature: 100° C., mixed gas ratio Ar/N$_2$: about 7, pressure: 4 torr, high frequency: 13.65 MHz, high frequency output: 400W.

Figure 3B:
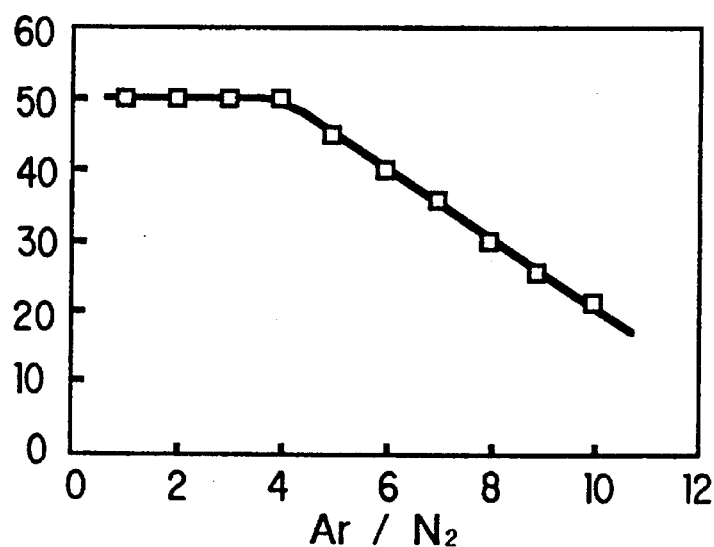
FIG. 3B is a chart of the composition ratio of the titanium nitride vs. composition ratio of mixed gas.

As is shown in FIG. 3B which shows the relationship between the composition ratio of nitrogen in the titanium nitride and the ratio of the mixed gas, the titanium containing ratio of the titanium nitride depends on the composition ratio of the Ar-N$_2$ mixed gas. In order to set the Ti containing ratio to be greater than the stoichiometry composition ratio, the Ar/N$_2$ value must be greater than 5. In the embodiment, the ratio Ar/N$_2$ is set to 7. When the titanium containing ratio of the titanium nitride 6A is set to greater than the stoichiometry composition ratio, the titanium component of the filament 8 is also increased because a lot of Ti is taken in the forming of the filament from the top electrode 6F when the breakdown voltage is applied to the antifuse material layer 7. As a result, the resistance of the filament 8 itself is reduced. The upper layer 6B made of aluminum alloy is deposited by sputtering or a CVD technique to a thickness of 800 nm. After completing the successive deposition of the titanium nitride 6A and aluminum alloy 6B, the second level metal interconnect 6 including the top electrode is patterned together with the antifuse material layer 7 by using a photolithographic process or a etching process.

The lower titanium nitride 6B may be substituted with titanium silicide. In this case, the titanium containing ratio must be set to 40% or more. The composition ratio of the titanium silicide greatly depends on the Ti ratio of the target material used in the sputtering. Namely, the Ti ratio of the titanium silicide is substantially the same as that of the target material, and is easily controlled by adjusting the composition ratio of the target material.

The top electrode 6F may be formed as a single layer of titanium nitride, instead of the composite layers.

After forming the top electrode 6F, the final passivation layer 9 is formed over the top surface (FIG. 1A).

In the semiconductor device having a plurality of thus formed antifuse elements, desired antifuse elements are selected and a breakdown voltage is applied between the bottom and top electrode. By the application of the breakdown voltage, the antifuse material layer 7 is broken down to form a filament 8 which is made of a compound which is formed by a mutual diffusion of the titanium silicide (bottom electrode 3F), antifuse material layer 7 and titanium nitride 6A (top electrode 6F). Thus, a sufficient amount of titanium is supplied for the forming of the filament 8 from both the bottom and top electrodes, because the titanium containing ratio of the bottom and top electrode is set to greater than the stoichiometry composition ratio, which results in a reduced resistance of the filament 8.

Figure 3C:
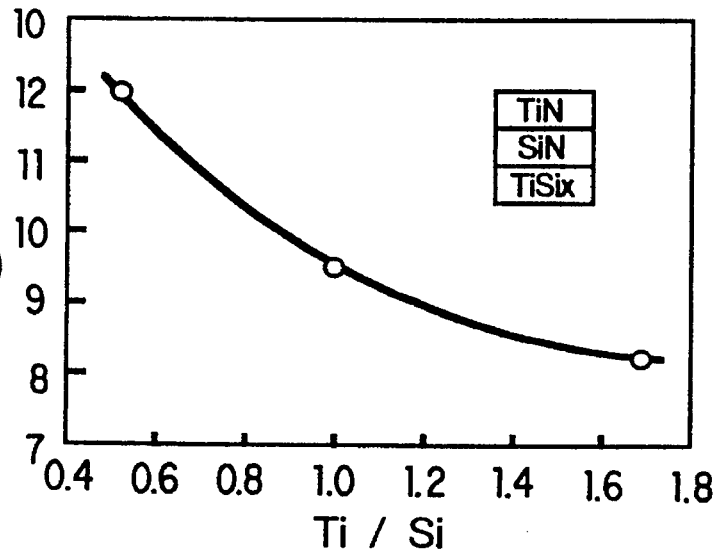
FIG. 3C is a chart of ON resistance vs. the composition ratio of the titanium silicide.
Figure 3:
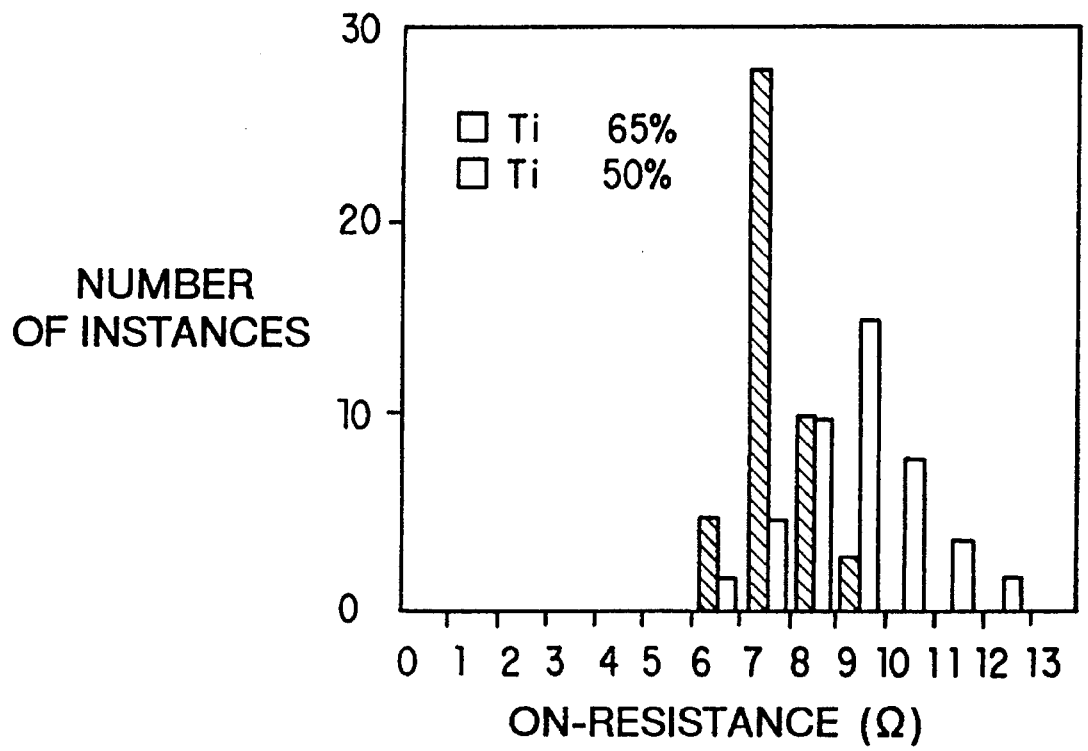
FIG. 3D is a histogram showing a distribution of the ON resistance, comparing the titanium silicide containing 65% of Ti and the titanium silicide containing 50% of Ti.
FIG. 3E is a chart of ON resistance vs. titanium containing percentage of the top electrode.
FIG. 3F shows an evenness of the surface of the bottom electrode which has been subjected to the wet processing.
FIG. 3G shows a roughness of the surface of the bottom electrode without being subjected to the wet processing.
FIG. 3H shows an indication of the smoothness of the surface by using solid angle.
FIG. 3I is a histogram showing the distribution of the breakdown voltage for the antifuse material layer, comparing between before and after wet chemical pre-cleaning.
Figure 3:
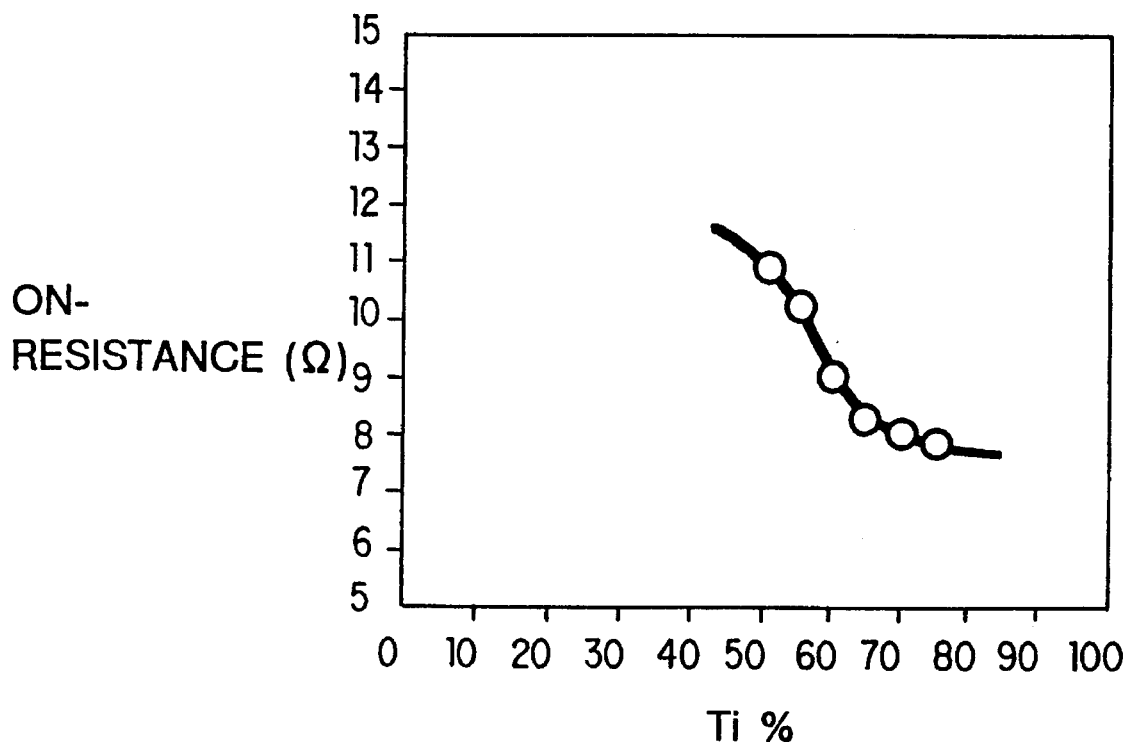
Figure 3:
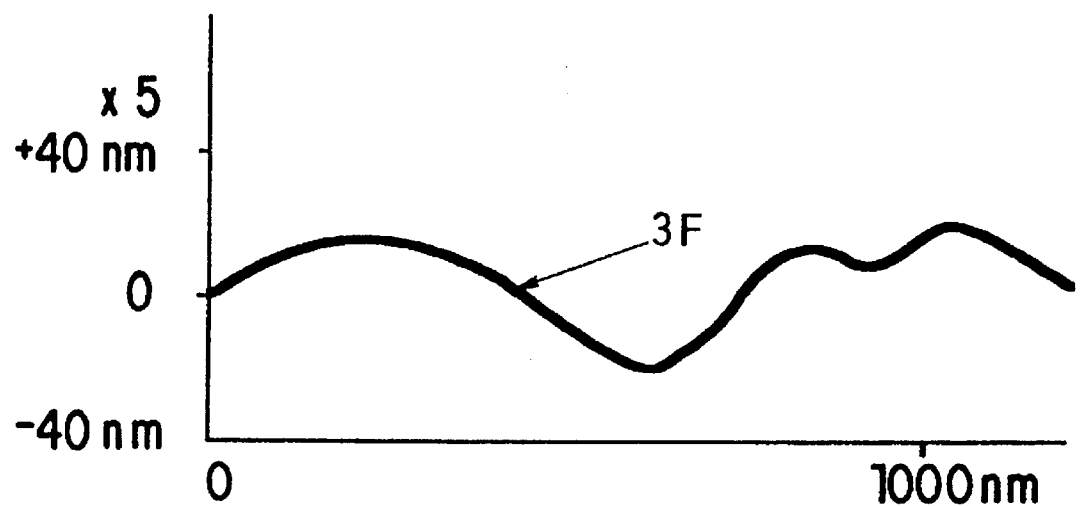
Figure 3:
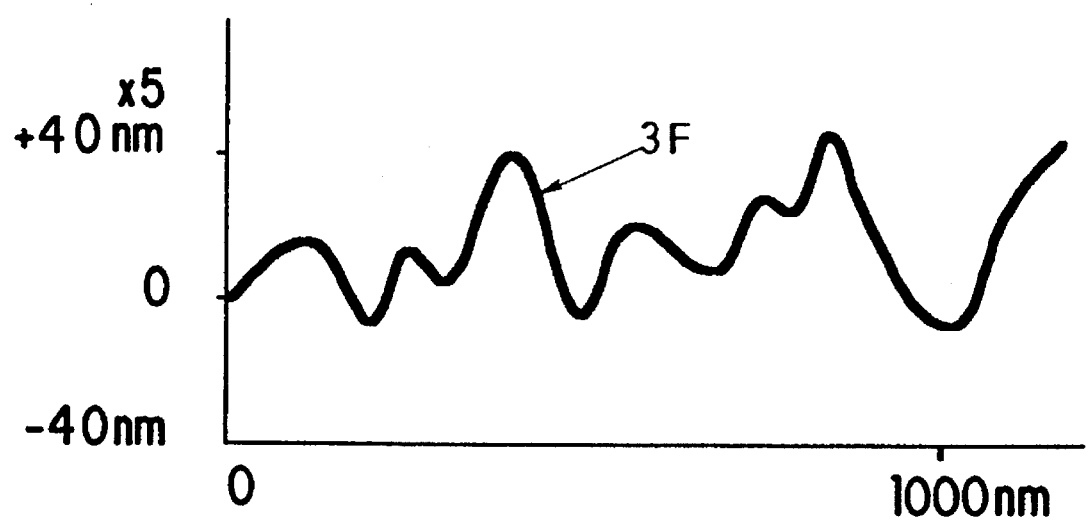
Figure 3:
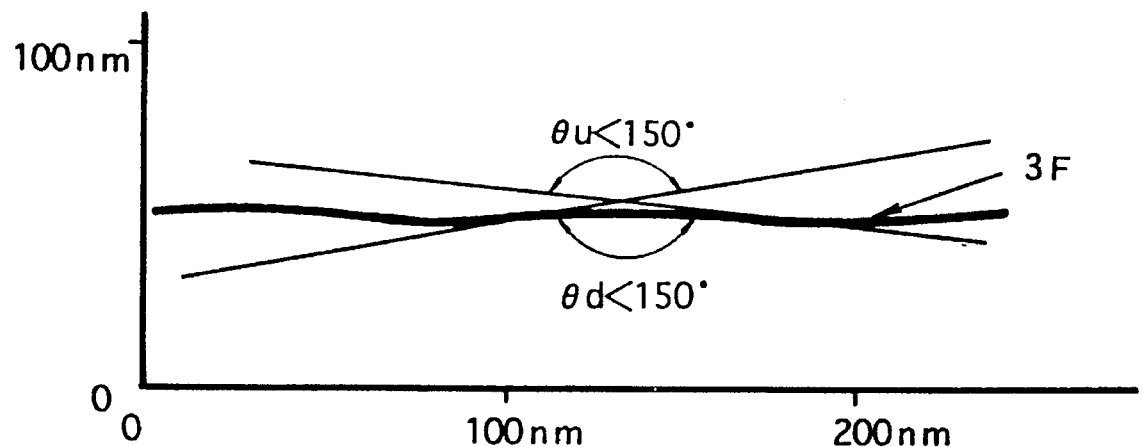
Figure 3:
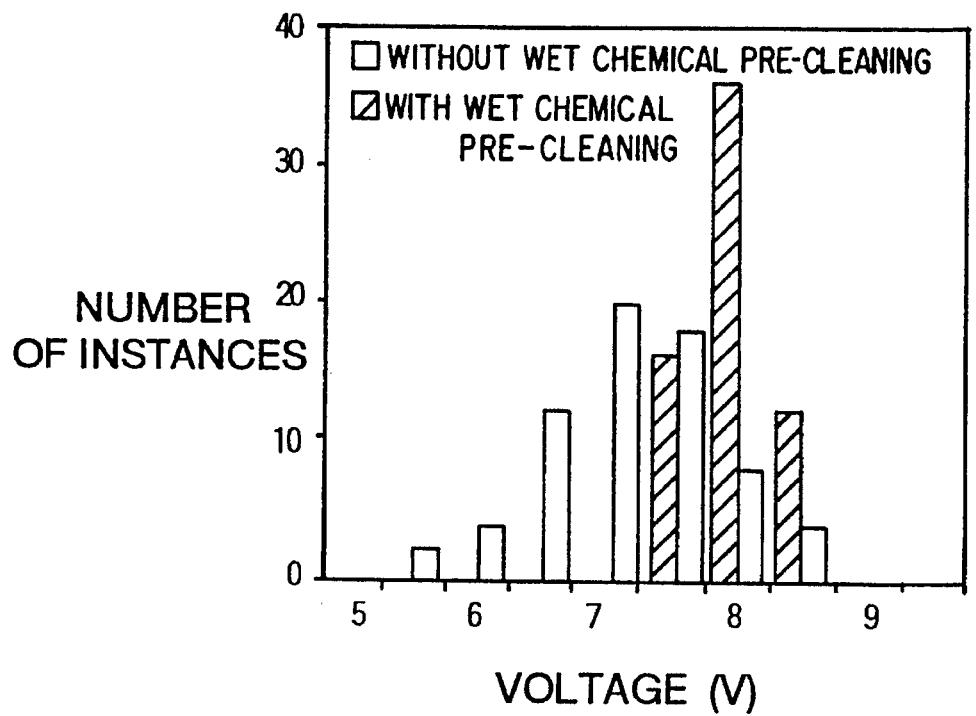

FIG. 3C shows a relationship between the composition ratio of the titanium silicide (Ti/Si) of the bottom electrode 3F and the ON resistance of the filament 8. As the Ti/Si value increases (i.e. the titanium containing ratio increases) beyond the stoichiometry composition ratio, the ON resistance of the filament 8 decreases.

FIG. 3D is a histogram showing a distribution of the frequency of the titanium nitride 6A for the ON resistance after the destruction of the antifuse material layer 7, comparing the titanium ratios 65% and 50%. The 65% titanium nitride has high frequency at a small ON resistance, and its variation is also small.

FIG. 3E is another chart showing the relationship between the titanium containing ratio of the titanium nitride 6A and the ON resistance. As the titanium containing ratio increases, the ON resistance abruptly decreases at a boundary point of 55%.

FIGS. 3F and 3G cross-sectionally show the surface state of the bottom electrode 3F, where the bottom electrode shown in FIG. 3F has been subjected to the wet processing, while the bottom electrode of FIG. 3G is provided with no wet processing. The cross-sectional surface line of FIG. 3F is much smoother and more uniform than that of FIG. 3G. Thus, the wet processing removes the protrusions caused by the crystal, and promotes the evenness of the surface of the bottom electrode 3F.

FIG. 3H also shows the evenness of the surface of the bottom surface after having being subjected to the wet processing. In this figure, the evenness of the cross-sectional surface line is represented by the angle between the two tangents at any given two adjacent points, where their quadratic differential values are zero. Both the downward angle θd and upward angle θu are in a range of 150°–180°, which indicates relatively high evenness.

FIG. 3I shows durability of the antifuse material layer 7 in the insulating state, comparing the wet processed bottom electrode and that without wet processing. When the wet processing is provided, the variation in the damaging voltage is small, and the durability of the antifuse material layer 7 is relatively uniform. Contrary to this, when no wet processing is carried out, there is a large variation in the damaging voltage for the antifuse material layer 7. This variation results from the protrusions on the surface of the metallic silicide. When the operation voltage is applied to the semiconductor device for a long time, the voltage is concentrated to the protrusions and sparks (short circuits) locally occur between the bottom and top electrodes which should be insulated from each other. This impairs the reliability of the semiconductor device.

The metallic silicide for the bottom electrode 3F may be formed of Si and any one of the group of W, TA, Nb, or Mo, other than titanium. These metal elements are all heavy and have a low self diffusion coefficient. No matter what metal is selected for forming the metallic silicide, the metal composition ratio is set to greater than the stoichiometry composition ratio. The crystal orientation of such metallic silicide is random and does not generate sharp protrusions. Especially, tungsten silicide has a superior EM endurance and a small resistivity, as well as a high stability without much alteration, and therefore, high reliability can be obtained for the semiconductor manufacturing process.

When using the tungsten silicide for the bottom electrode 3F, a negative voltage (lower voltage) is applied to the bottom electrode, while a positive voltage (higher voltage) is applied to the top electrode. Under this condition, when the breakdown voltage is applied to the electrodes for a short time and the antifuse material layer 7 is broken down, a large electron stream flows from the bottom electrode 3F to the top electrode 6F. That is, a high level of current density is momentarily generated, and W elements are supplied to the filament 8 from the bottom electrode 3F. a sufficient amount of W is used in the filament 8, and therefore, the filament having a superior EM endurance can be obtained.

Figure 4:
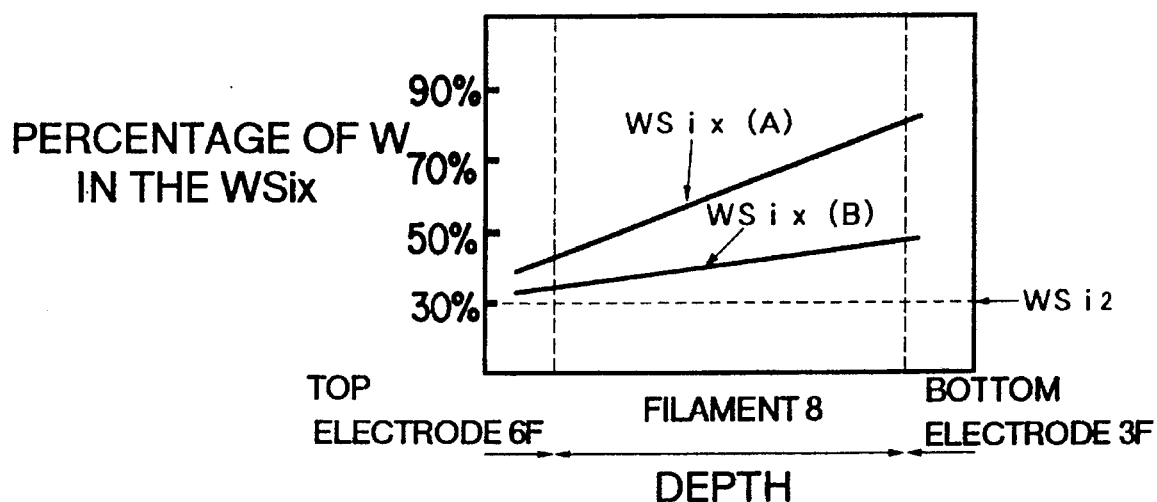
FIG. 4A is a chart of the tungsten content vs. depth of the filament.
FIG. 4B shows a relationship between cumulative failure and EM life time of a different filament material.
FIG. 4C is a histogram showing a distribution of ON resistance of the bottom electrode for different tungsten content.
FIG. 4D is a chart of ON resistance vs. tungsten content of the bottom electrode.
Figure 4:
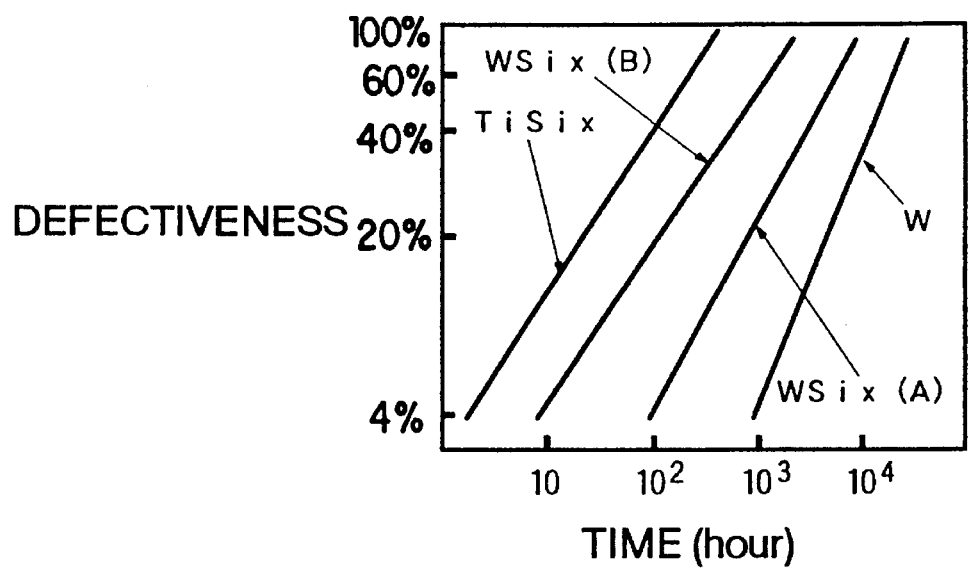
Figure 4:
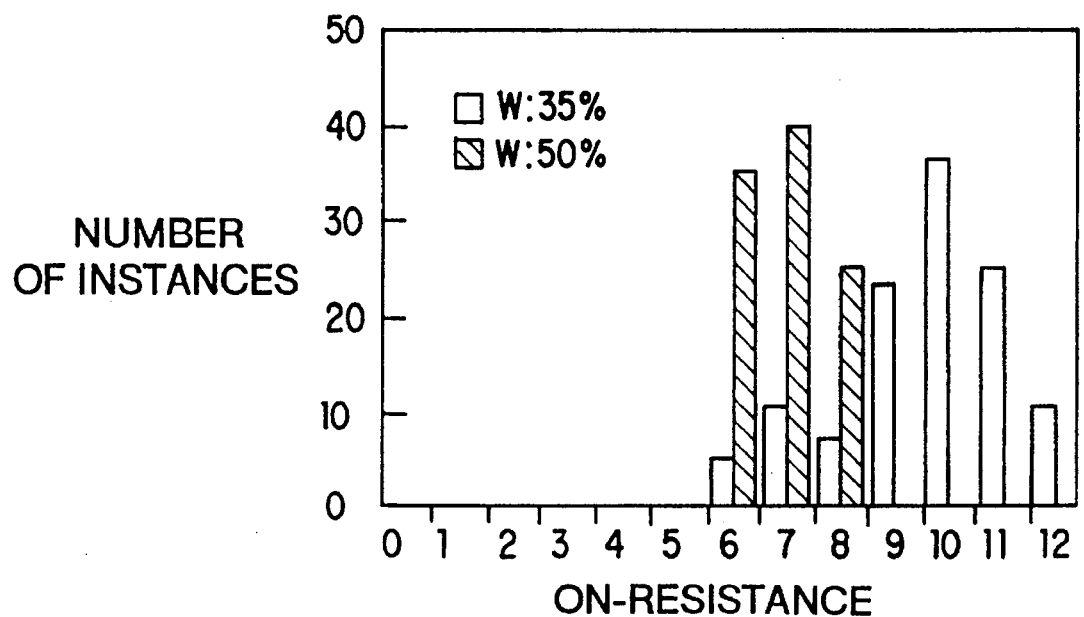
Figure 4:
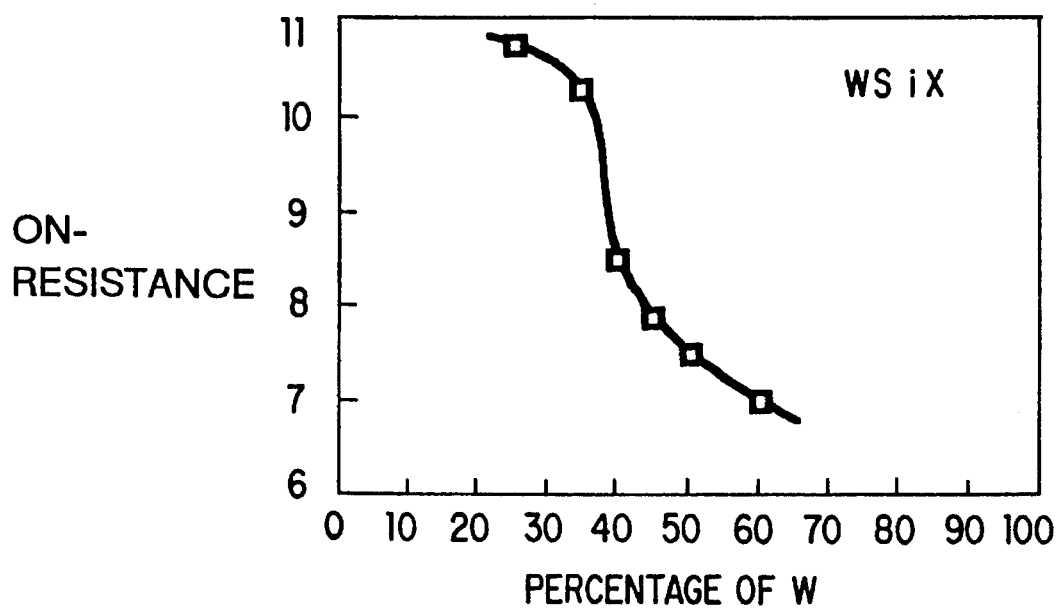

FIG. 4A shows the W containing percentage of the filament 8, with the X axis as a depth of the filament 8 and the Y axis as a percentage of W, comparing the tungsten silicides "A" and "B", both having a greater composition ratio of W than the stoichiometry composition ratio. The tungsten silicides "A" and "B" show a similar tendency. Although the W containing amount in the filament 8 decreases from the bottom electrode 3F toward the top electrode 6F, the filament 8 still contains more tungsten elements than the stoichiometry composition ratio because the bottom electrode 3F contains about 80% of W in data "A" and about 45–50% of W in data "B".

FIG. 4B is a chart showing a relationship between defectiveness and application of test voltage for a different filament material, where the X axis represents length of application of the test voltage and the Y axis represents defectiveness such as a breakage. As can be seen from the chart, as the W content increases, the EM endurance of the filament is improved. Tungsten silicide is generally superior in EM endurance to titanium silicide ($TiSi_x$). In the case where the filament 8 is made of only W (i.e. a tungsten plug or through hole is formed), the W plug has an EM endurance further superior to that of the tungsten silicide, and the resistance of the filament 8 itself is greatly reduced.

FIG. 4C is a histogram showing a distribution of the ON resistance after forming the filament 8, comparing the bottom electrode 3F containing 35% of W and 50% of W. As is apparent from the chart, when the bottom electrode contains more tungsten, the ON resistance become small, and variation of the ON resistance is reduced.

FIG. 4D also shows a relationship between the W containing percentage and the variance of the ON resistance after forming the filament 8. This figure also shows the fact that a greater W containing percentage results in a smaller ON resistance. Especially, at a boundary point of 40%, the ON resistance abruptly decreases.

The evenness of the surface of the bottom electrode 3F can be defined by the diameter of the crystal grain, center line average height, or the solid angle of the crystal protrusions. Smaller crystal grains results in a flatter surface of the bottom electrode, which further results in the improved durability of the antifuse material layer 7.

Figure 5A:
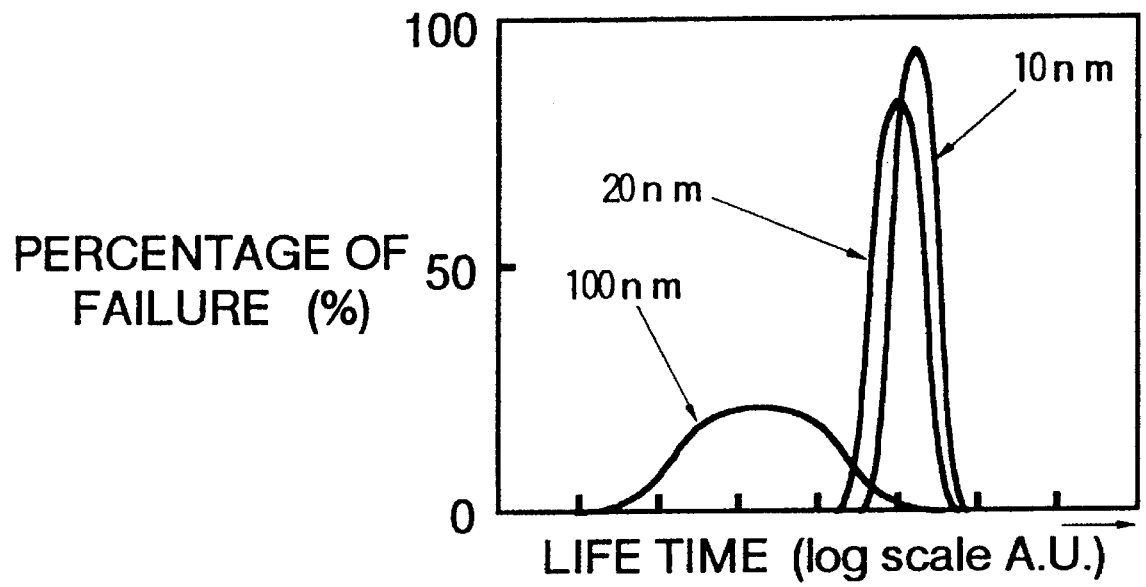
FIGS. 5A and 5B are charts showing a relationship between the diameter of the crystal grain and the durability of the antifuse material layer.
Figure 5B:
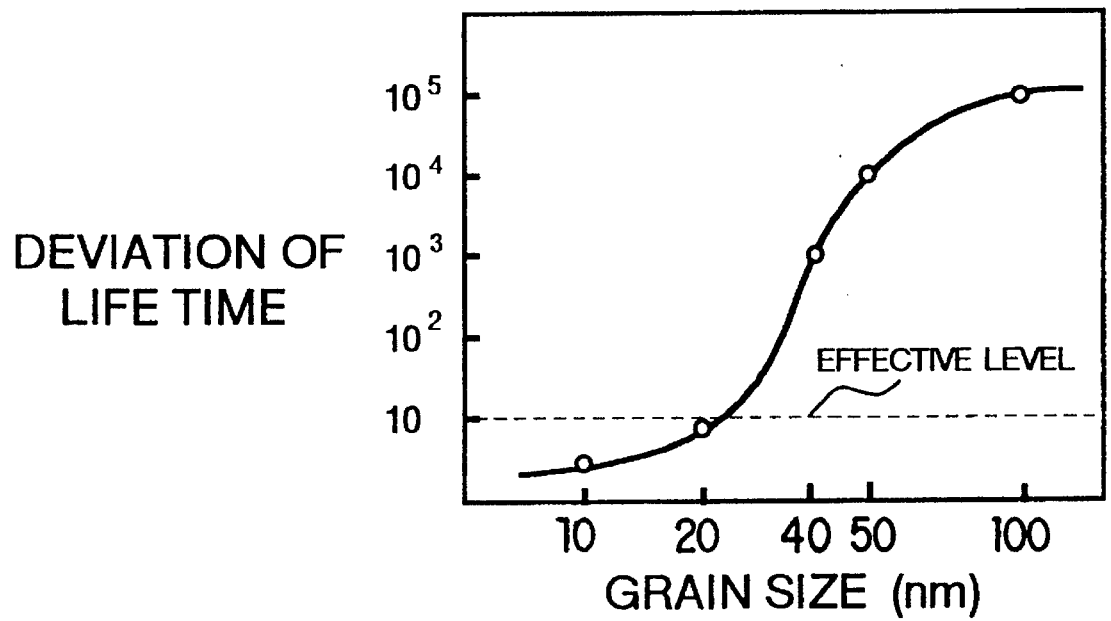

FIGS. 5A and 5B show a relationship between the crystal size and the durability of the antifuse material layer 7. In FIG. 5A, the X axis represents time taken for the breakdown of the antifuse material layer caused by the operation voltage, and the Y axis represents a breakdown rate. When the diameter of the crystal grain of the bottom electrode 3F is 100 nm, the durability of the antifuse material layer 7 varies over a wide range. As the diameter of the crystal grain decreases, the variation decreases and the life of the antifuse material layer becomes longer. In FIG. 5B, the X axis represents a diameter of the crystal grain, and the Y axis represents a deviation of life time of the antifuse material layer 7. In order to maintain the breakdown rate within practical levels, the diameter of the crystal gains must be 20 nm or less. In other words, when the bottom electrode is formed by fine crystal grains having a diameter of 20 nm or less, the surface of the bottom electrode becomes relatively flat and even, the antifuse material layer 7 is uniformly formed, and its durability is greatly improved.

Figure 6A:
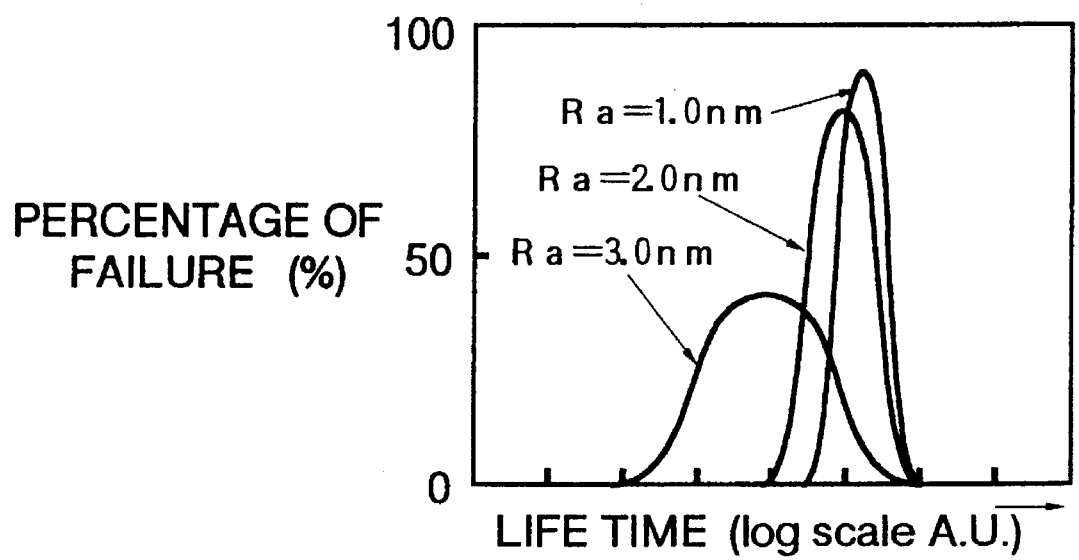
FIGS. 6A and 6B are charts showing a relationship between the surface roughness represented by a center line average height Ra and the life of the antifuse material layer.
Figure 6B:
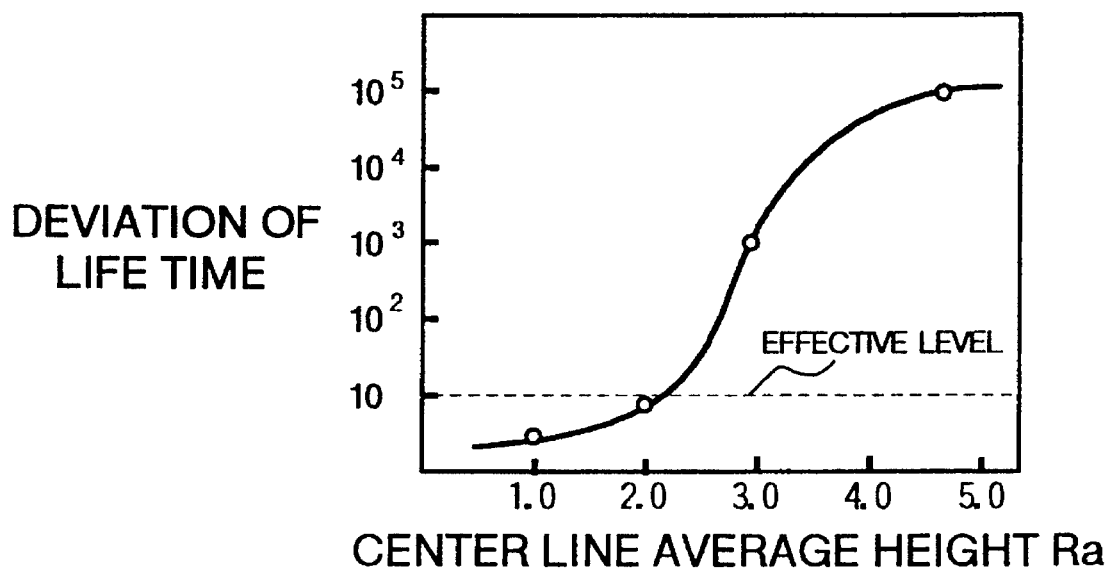

FIGS. 6A and 6B show a relationship between the durability of the antifuse material layer 7 against the breakdown caused by the operation voltage and the roughness of the surface of the bottom electrode 3F. The roughness is represented as a center line average height Ra. In FIG. 6A, the X axis represents time, and the Y axis represents a breakdown rate. When the center line average height Ra is 3.0 nm, the life of the antifuse material layer 7 varies over a wide range. As the average height Ra decreases, the variation range is narrowed and the life of the antifuse material layer 7 becomes longer. As is shown in FIG. 6B, the center line average height (Ra) of the surface of the bottom electrode 3F must be 2.0 nm or less in order to maintain the practical level.

Figure 7A:
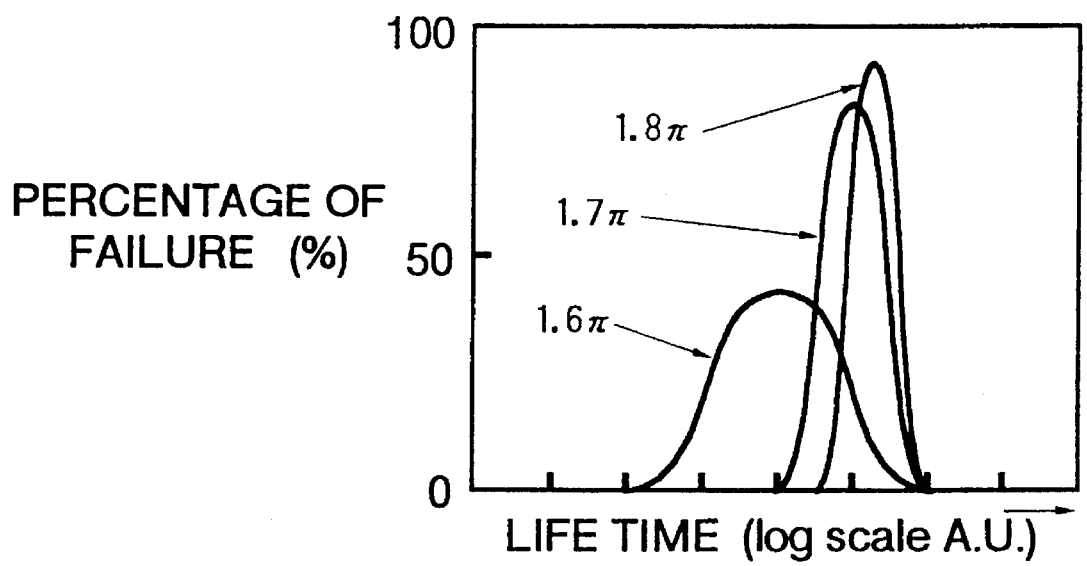
FIGS. 7A and 7B are charts showing a relationship between the solid angle of the crystal grain on the surface of the bottom electrode and the durability of the antifuse material layer.
Figure 7B:
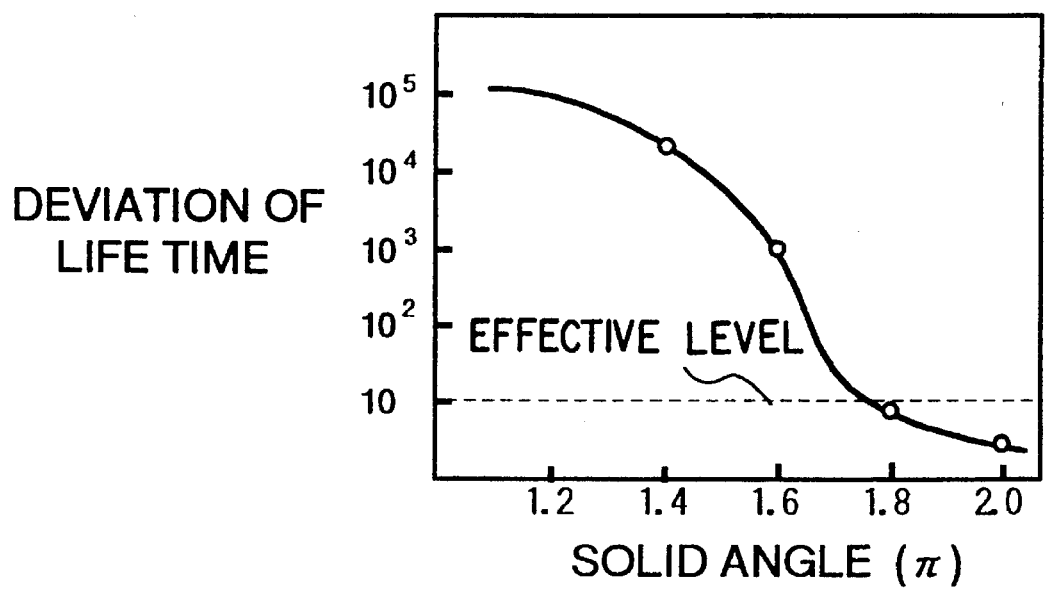

FIGS. 7A and 7B also show the relationship between the roughness of the surface of the bottom electrode 3F and the life of the antifuse material layer 7 by using a solid angle of the crystal grain, having a diameter 1 nm–1μm, on the surface of the bottom electrode. Similarly to FIGS. 5A, 5B, and FIGS. 6A, 6B, as the solid angle becomes larger (which means the surface becomes flatter), the variation in life time of the antifuse material layer 7, against the breakdown, becomes small and the life becomes long. As shown in FIG. 7B, in order to maintain the practical level for the antifuse material layer 7, the solid angle of the crystal grain must be set to $1.8\pi$–$2.0\pi$.

Figure 8:
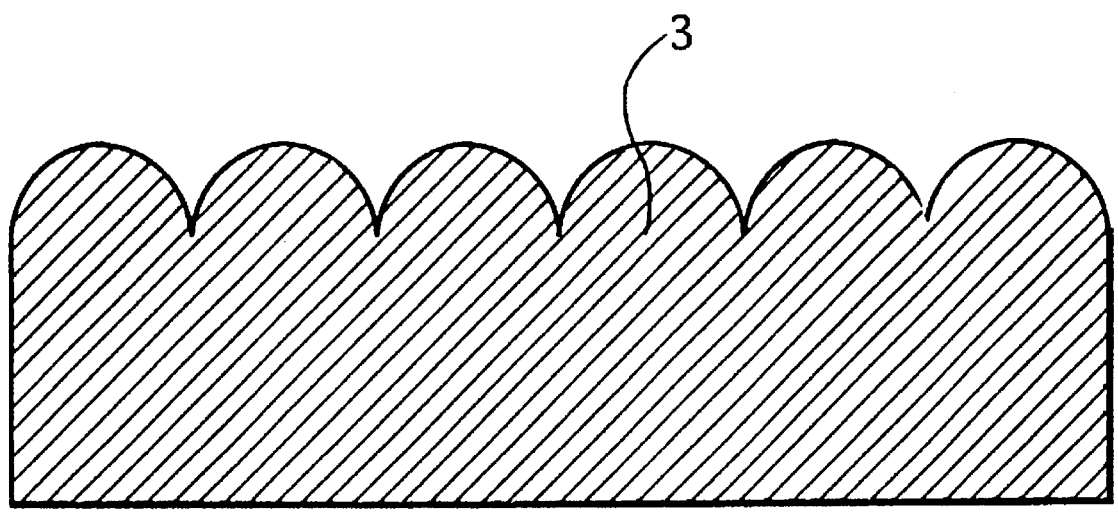
FIG. 8 is a cross-sectional view of the bottom electrode of the antifuse element according to the invention.

FIG. 8 is an enlarged cross-sectional view of the bottom electrode 3F made of titanium silicide, which is formed by silicidizing the titanium layer at a temperature of 600°–800° C. under a pressure of $10^{-5}$–$10^{-10}$ torr. There are uniform and gentle hemispherical protrusions on the surface, and the sharp protrusions are greatly reduced. The thus formed bottom electrode 3F may be further subjected to the wet processing for enhancing the smoothness of the surface.

Second Embodiment

In this embodiment, the bottom electrode 3F of the antifuse element includes a semiconductor region (diffusion layer) formed on the main surface of the semiconductor substrate. The manufacturing processes for this type of antifuse element are shown in FIGS. 9A–9F.

Figure 9:
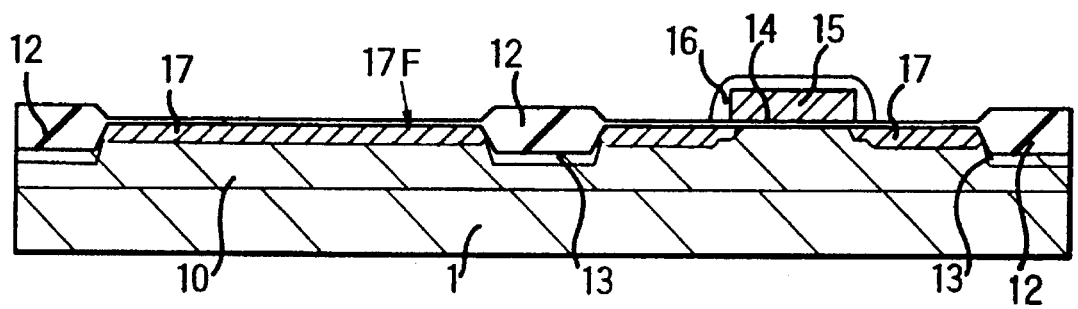
FIGS. 9A, 9B, 9C, 9D, 9E, and 9F show the processes of manufacturing a semiconductor device having antifuse elements according to the second embodiment of the invention.
Figure 9:
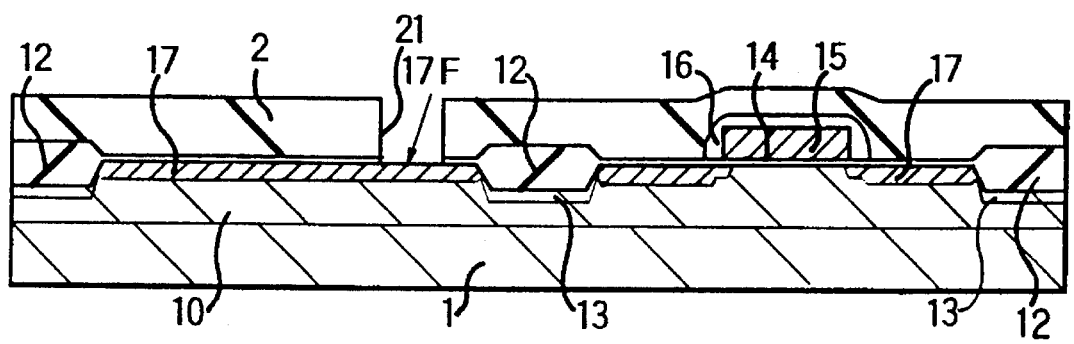
Figure 9:
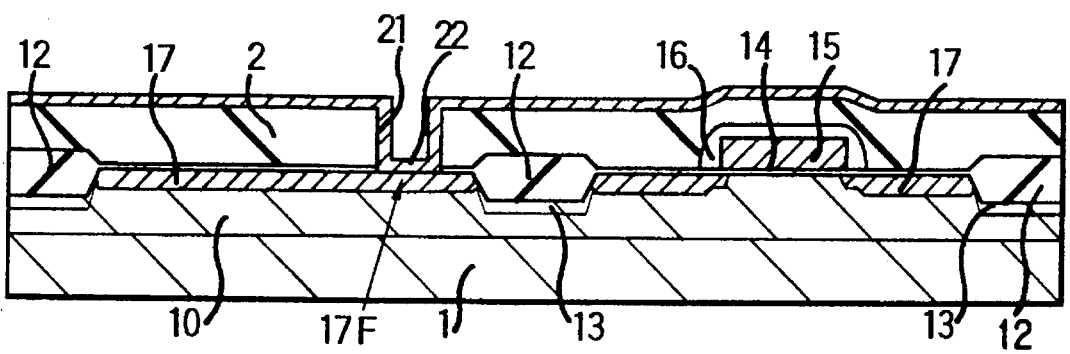

First, as is shown in FIG. 9A, an n-type semiconductor region 17 is formed on the semiconductor substrate 1. The bottom electrode 17F is to be formed on a part of the n-type semiconductor region 17. More particularly, the bottom electrode 17F comprises the n-type semiconductor region 17 and the titanium silicide 23 (FIG. 9D) formed on the n-type semiconductor area 17. The n-type semiconductor region 17 is actually formed on the main surface of the p-type well region 10 during the same process as the forming of the source region and drain region of the semiconductor element (MISFET). The MISFET is formed in an area enclosed by the insulator 12 and the p-type channel stopper region 13. The insulator 12 is made of a thick field insulating layer formed by oxidizing the selected surface of the substrate 1. The MISFET has an LDD (Lightly Doped Drain) structure, and comprises a p-type well region 10 as a channel forming region, a gate insulating layer 14, a gate electrode 15, and a pair of n-type semiconductor regions 17 as a source region and a drain region. The manufacturing method of this type of MISFET is known to those skilled in the art, and therefore, will not be described here. In the LDD structure, a side wall spacer 16 is formed around the gate electrode 15. The impurity concentration of the drain region adjacent to the channel forming region is set low.

Next, as is shown in FIG. 9B, the dielectric layer 2 is formed over the substrate 1, and the antifuse connecting hole 21 is formed in the dielectric layer 2. Within the antifuse connecting hole 21, the surface of the bottom electrode 17F is exposed.

Then, in FIG. 9C, the Ti film 22 is formed all over the exposed surface, that is, on the dielectric layer 2, the bottom electrode 17F, and side wall of the connecting hole 21. The Ti film is deposited by sputtering to a thickness of 40 nm.

Figure 9D:
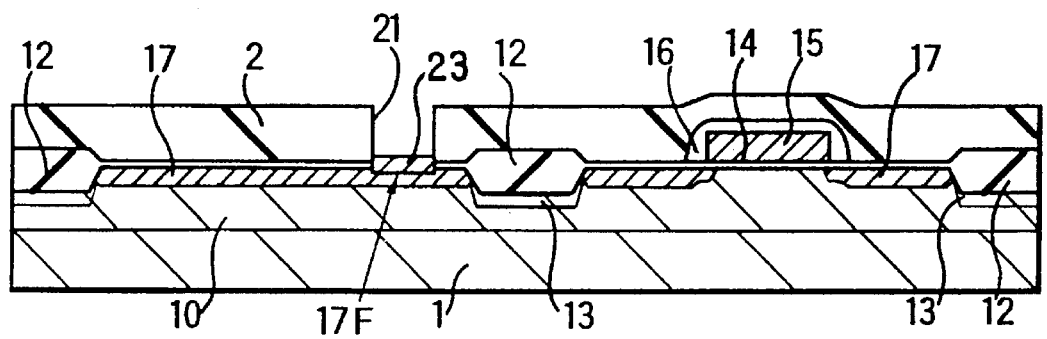

The Ti film formed on the bottom electrode 17F reacts with Si contained in the bottom electrode to form a titanium silicide layer 23 (silicidation). Similarly to the first embodiment, the silicidation is carried out by rapid thermal annealing at a temperature lower than 700° C., *for example, at* 650° C. for 30 seconds. The non-reacted Ti film is removed from the surface of the dielectric layer 2 and the side wall of the antifuse connecting hole 21, by selective etching, after the completion of the silicidation, as is shown in FIG. 9D. For the selective etching, for example, sulfuric acid hydrogen peroxide solution (i.e. mixture of $H_2SO_4$ and $H_2O_2$) is used as an etchant. The selective etching is carried out for 10 minutes at 100° C.

Then, similarly to the first embodiment, the surface of the titanium silicide 23 within the antifuse connecting hole 21 is subjected to a wet processing using a ammonia hydrogen peroxide solution, or a isotropic chemical dry etching using fluoride gas, for the purpose of enhancing the evenness of the surface of the titanium silicide.

Figure 9E:
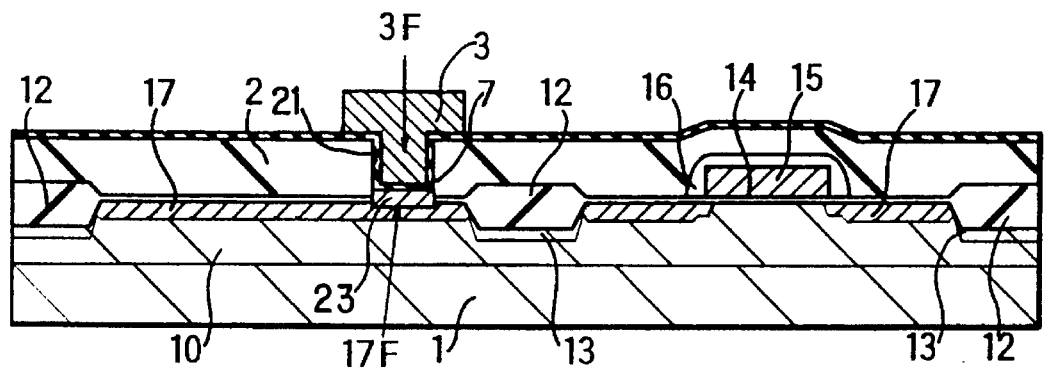

Next, as is shown in FIG. 9E, the antifuse material layer is formed at least on the titanium silicide 23 within the antifuse connecting hole 21, under the same conditions as the first embodiment. Then, the first level metal interconnect 3 and the top electrode 3F are simultaneously formed at a position corresponding to the bottom electrode 17F. The metal interconnect 3 and the top electrode 3F have a three-layer structure with successive deposition by sputtering of a titanium nitride layer, an aluminum alloy layer, and titanium nitride layer. These layers are all formed by sputtering, and the lower titanium nitride layer has a thickness of 20 nm, the aluminum alloy layer has a thickness of 800 nm, and the upper titanium nitride is deposited to a thickness of 50 nm. After patterning the top electrode 3F, the antifuse material layer 7 is also patterned with the top electrode 3F as a patterning mask. At this stage, the antifuse element is completed, which comprises a bottom electrode 17F (i.e. titanium silicide 23), an antifuse material layer 7, and a top electrode 3F.

Figure 9F:
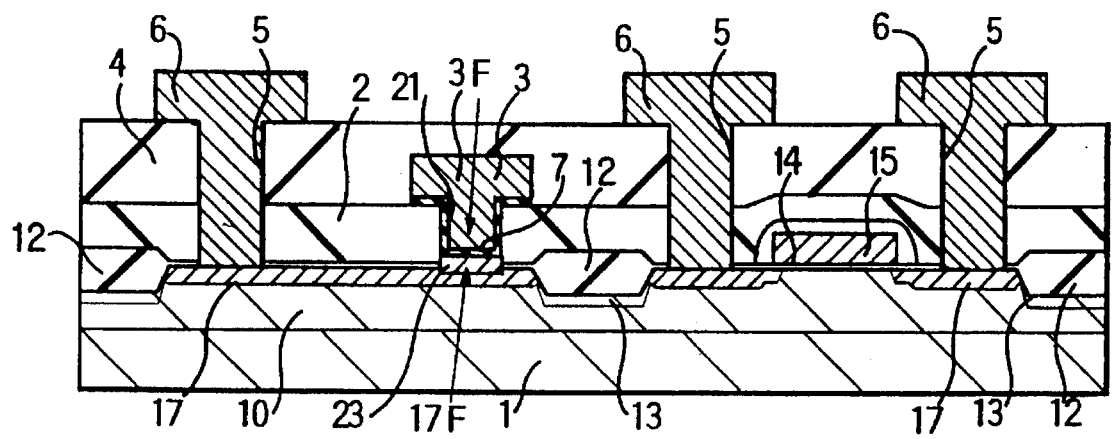

Finally, as is shown in FIG. 9F, the dielectric layer 4 and the through hole 5 are formed, and then the second level metal interconnect 6 is formed. On the metal interconnect 6, the final passivation layer 9 (not shown) is formed.

Third Embodiment

In this embodiment, the bottom electrode of the antifuse element is formed on the insulator for insulating the complementary MISFETs. FIGS. 10A–10E shows the manufacturing processes of the antifuse elements provided in the semiconductor device according to this embodiment.

Figure 10A:
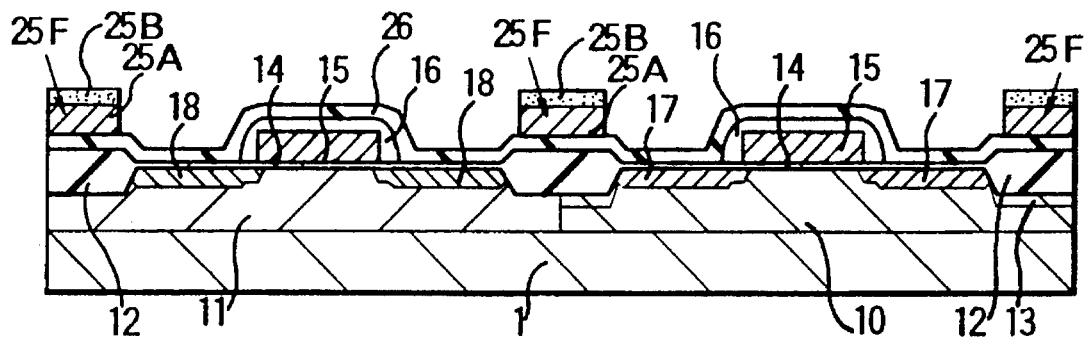
FIGS. 10A, 10B, 10C, 10D and 10E show the processes of manufacturing a semiconductor device having antifuse elements according to the third embodiment of the invention.

First, the bottom electrode 25F is formed on the insulator 12 for the MISFET via a dielectric layer 26, as is shown in FIG. 10A. The bottom electrode 25F comprises a Si layer 25A and a Ti layer 25B. The Si layer 25A is formed by sputtering or a CVD technique to a thickness of 200 nm, and is in an amorphous state or polycrystalline state. The Ti layer 25B is formed by sputtering to a thickness of 40 nm.

The complementary MISFETs consist of a n-channel MISFET formed on the p-type well region 10 and a p-channel MISFET formed on the n-type well region 11. The n-channel MISFET comprises a p-type well region 10 as a channel forming region, a gate insulating layer 14, a gate electrode 15, and a pair of n-type semiconductor regions 17 as a source region and a drain region. The p-channel MISFET comprises a n-type well region 11 as a channel forming region, a gate insulating layer 14, a gate electrode 15, and a pair of p-type semiconductor regions 18 as a source region and a drain region. Of course, the MISFET is not limited to this structure, but preferably has an LDD structure. Although, in this embodiment, the substrate 1 has a twin well structure having a p-type well region 10 and an n-type well region 11, it is not limited to this structure. For example, the substrate 1 may be p-type semiconductor and have a single well structure without a p-type well region 10. The dielectric layer 26 may be made of silicon oxide deposited by a CVD technique with low temperature and low pressure, and has a thickness of 100–200 nm.

Figure 10B:
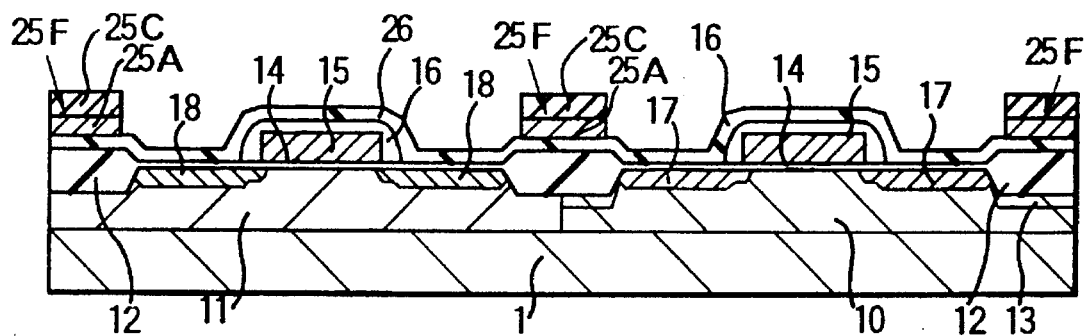

Next, as is shown in FIG. 10B, the Ti layer 25B reacts with a portion of the Si layer 25A, and a titanium silicide layer 25C is formed on the remaining Si layer 25A. The silicidation is carried out by rapid thermal annealing at a temperature lower than 700° C, for example, at 650° C., for 30 seconds. Thus, a lamination layer (i.e. polycide layer) consisting of the Si layer 25A and the titanium silicide layer 25C is completed on the insulator 12, which serves as a bottom electrode 25F. Then, the dielectric layer 2 is formed all over the surface including the bottom electrode 25F, and the antifuse connecting hole 21 is formed in the dielectric layer 2 at a position corresponding to the antifuse element so that the bottom electrode 25F is exposed.

The exposed surface of the bottom electrode 25F (i.e. the surface of the titanium silicide 25C) is subjected to the wet processing using an ammonia hydrogen peroxide solution so as to enhance the flatness of the surface. The wet processing may be substituted by the isotropic chemical dry etching using fluoride gas.

Figure 10C:
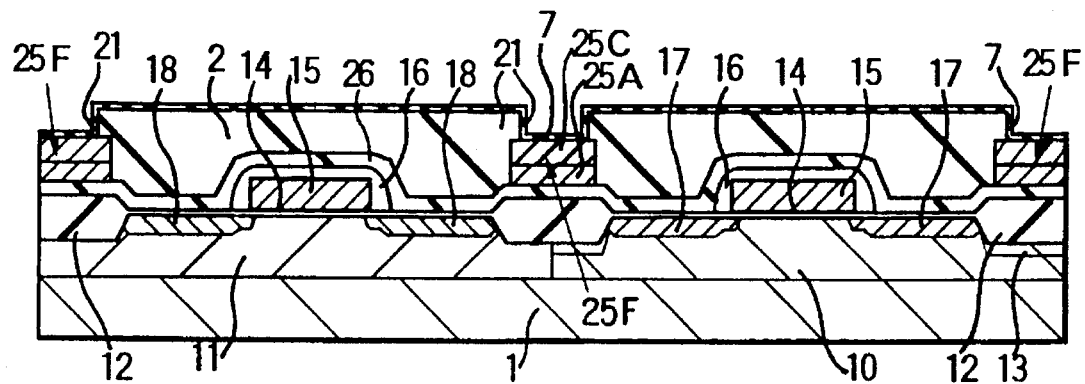

Then, in FIG. 10C, the antifuse material layer 7 is formed all over the surface of the dielectric layer 2 as well as on the exposed surface of the titanium silicide 25C and the side wall of the antifuse connecting hole 21, under the same conditions as the first embodiment. Because of the even and flat surface of the bottom electrode 25F, a fine quality antifuse material layer can be obtained with almost no defects.

Figure 10D:
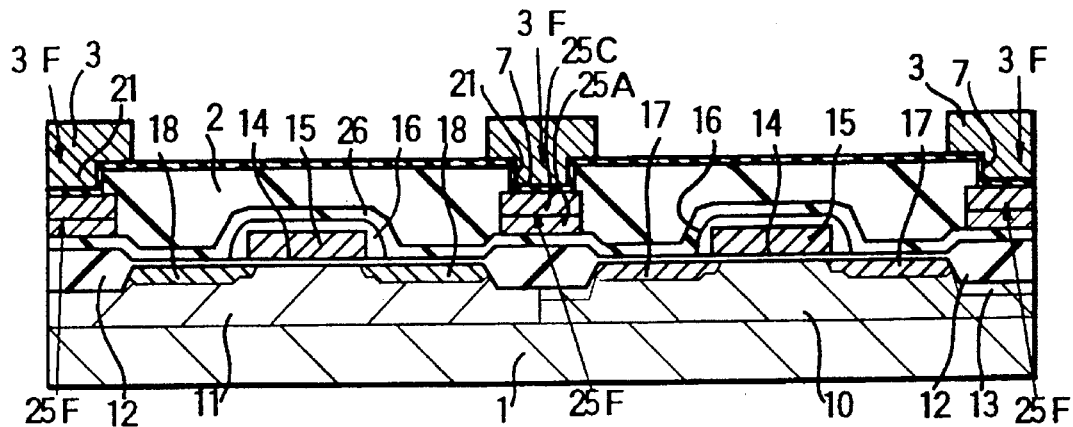

In FIG. 10D, the first level metal interconnect 3 is formed, including the top electrode 3F formed in a portion of the metal interconnect 3. The top electrode 3F has a three-layer structure with a successive deposition of a titanium nitride layer, an aluminum alloy layer, and a titanium nitride layer, similarly to the second embodiment. After the patterning of the top electrode 3F, the antifuse material layer 7 is patterned by using the top electrode 3F as a patterning mask. At this stage, the antifuse element is completed, which comprises a bottom electrode 25F (titanium silicide layer 25C an antifuse material layer 7, and a top electrode 3F.

Figure 10E:
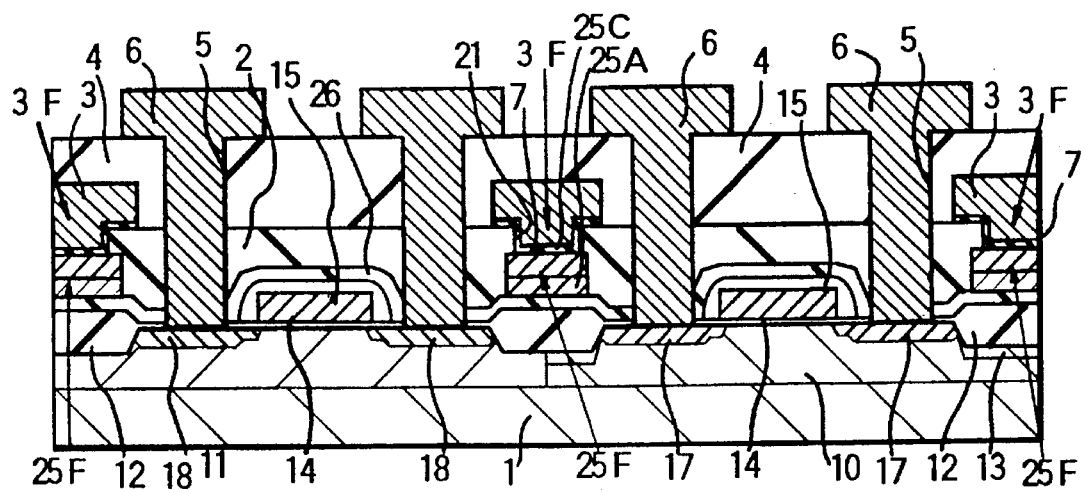

Finally, after the forming of the dielectric layer 4 and the through hole 5, the second level metal interconnect 6 is formed, as is shown in FIG. 10E. On the second level metal interconnect 6, the final passivation layer 9 (not shown) is formed.

Thus, in this embodiment, the gate electrode 15 and the bottom electrode 25F constitute a two-layer gate interconnect, and the first level metal interconnect 3 and the second level metal interconnect 6 constitute another two-layer interconnect. The antifuse element comprises a bottom electrode 25F which is an upper layer of the gate interconnect, and a top electrode 3F which is a lower layer of the other interconnect.

Fourth Embodiment

In this embodiment, the bottom electrode of the antifuse element is formed of interconnects which are connected in a self aligning manner to a source region and a drain region of the MISFET.

FIGS. 11A–11G shows the manufacturing processes of the antifuse elements provided in the semiconductor device according to this embodiment.

Figure 11A:
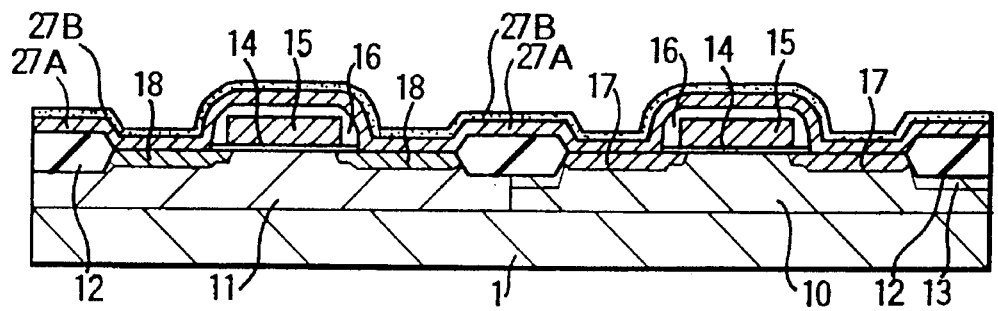
FIGS. 11A, 11B, 11C, 11D, 11E, 11F and 11G show the processes of manufacturing a semiconductor device having antifuse elements according to the fourth embodiment of the invention.

First, a laminated layer is formed all over the surface including the gate electrode 15 by successively depositing a Si layer 27A and a Ti layer 27B, as is shown in FIG. 11A. The laminated layer contacts the n-type semiconductor region 17, which is either a source or drain region, and the p-type semiconductor region 18 which is either a drain or source region. The lower layer of the laminated layer is connected to the n-type semiconductor region 17 and the p-type semiconductor region 18 in a self aligning manner, and the upper layer constitutes an interconnect on the insulator 12. A portion of the laminated layer is used for the bottom electrode 17F of the antifuse element. The lower Si layer 17A is formed by either of a CVD or sputtering method to a thickness of 80 nm. The upper Ti layer 27B is formed by sputtering to a thickness of, for example, 40 nm.

Figure 11B:
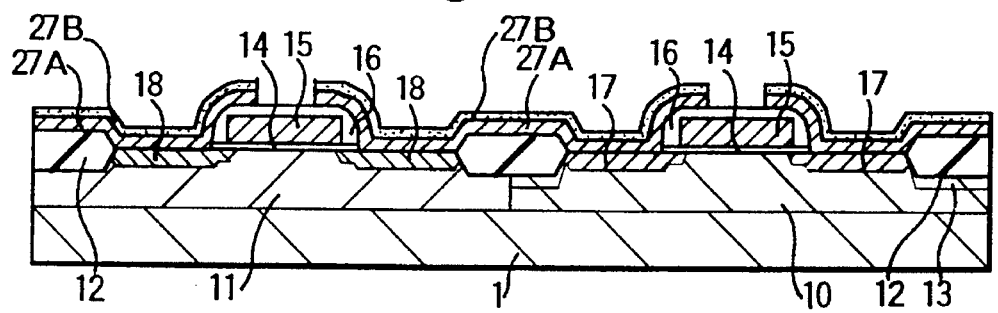
Figure 11C:
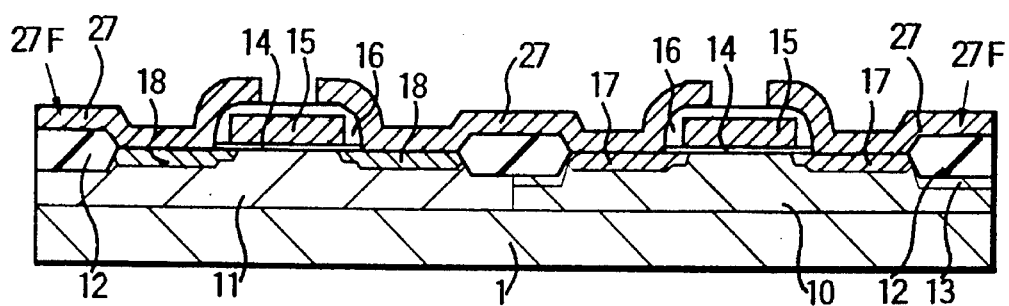

The laminated layer is patterned as show in FIG. 11B.

Then, the silicidation of the laminated layer is carried out so that the Ti of the upper layer reacts with the Si of the lower layer to form a titanium silicide layer 27. The bottom electrode 27F of the antifuse element is formed in a portion of the silicide layer 27. Similarly to the first embodiment, the silicidation is performed by rapid thermal annealing at a temperature below 700° C. (for example, at 650° C.) for 30 seconds.

The surface of the bottom electrode 27F is subjected to wet processing using an ammoniacal hydrogen peroxide solution so as to enhance the flatness of the surface. The wet processing may be substituted by isotropic chemical dry etching using fluoride gas. This process (wet etching or isotropic chemical dry etching) may be carried out later, that is, after the forming of the antifuse connecting hole 21 and before the forming of the antifuse material layer 7.

Figure 11D:
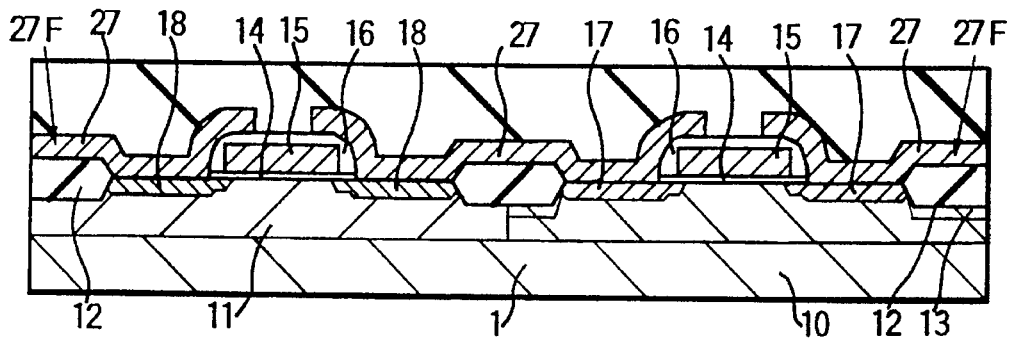

Next, as is shown in FIG. 11D, the inter-layer dielectric layer 2 is formed all over the surface of the substrate including the bottom electrode 27F.

Figure 11E:
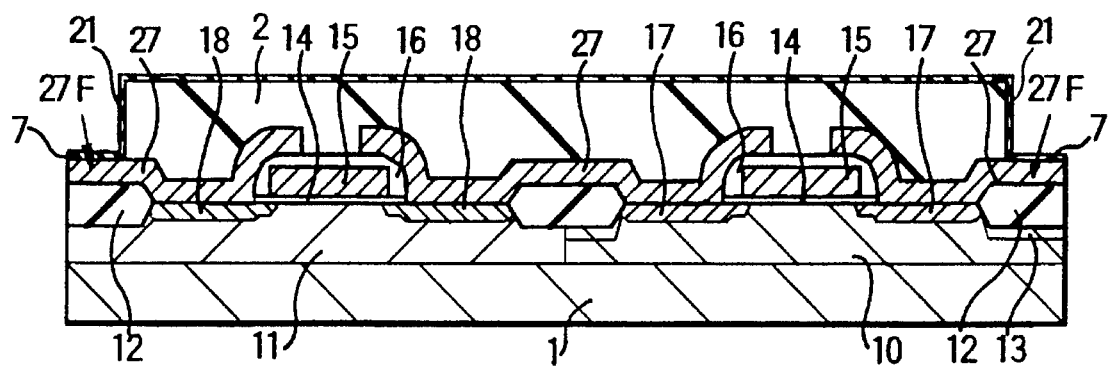

In FIG. 11E, the antifuse connecting hole 21 is formed in the dielectric layer 2 at a position corresponding to the insulator 12 (i.e. the antifuse element forming area). The surface of the bottom electrode 27F is exposed in the antifuse connecting hole.

Then, the antifuse material layer 7 is formed on the all over the surface including the exposed surface of the bottom electrode 27F. The uniform and fine quality antifuse layer is formed, with fewer defects, under the same conditions as in the first embodiment.

Figure 11F:
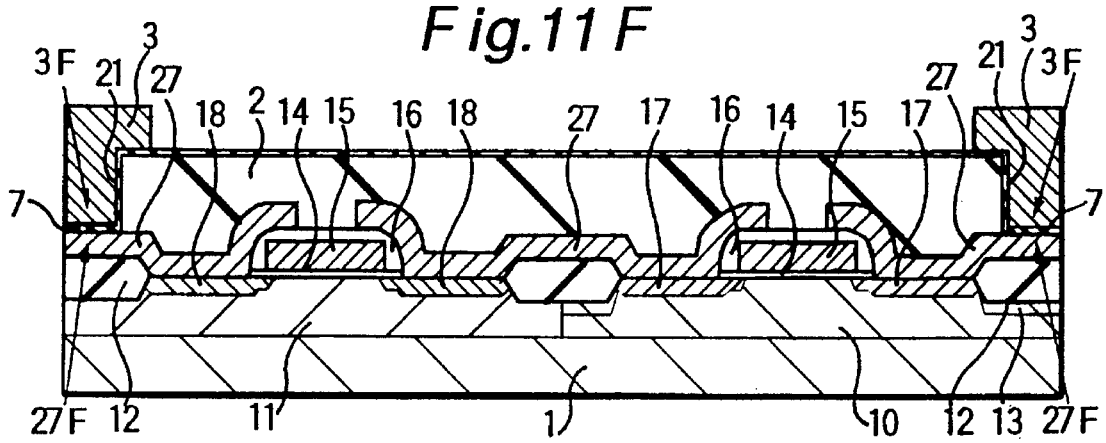

Next, in FIG. 11F, the metal interconnect 3 is formed as a first level metal interconnect layer, and in a part of the metal interconnect 3, the top electrode 3F is formed. Similarly to the second embodiment, the top electrode 3F has a three-layer structure formed by successively depositing titanium nitride, aluminum alloy, and titanium nitride. After the patterning of the top electrode 3F, the antifuse material layer 7 is patterned by using the top electrode 3F as a patterning mask. At this stage, the antifuse element is completed, comprising the bottom electrode 27F, the antifuse material layer 7, and the top electrode 3F.

Figure 11G:
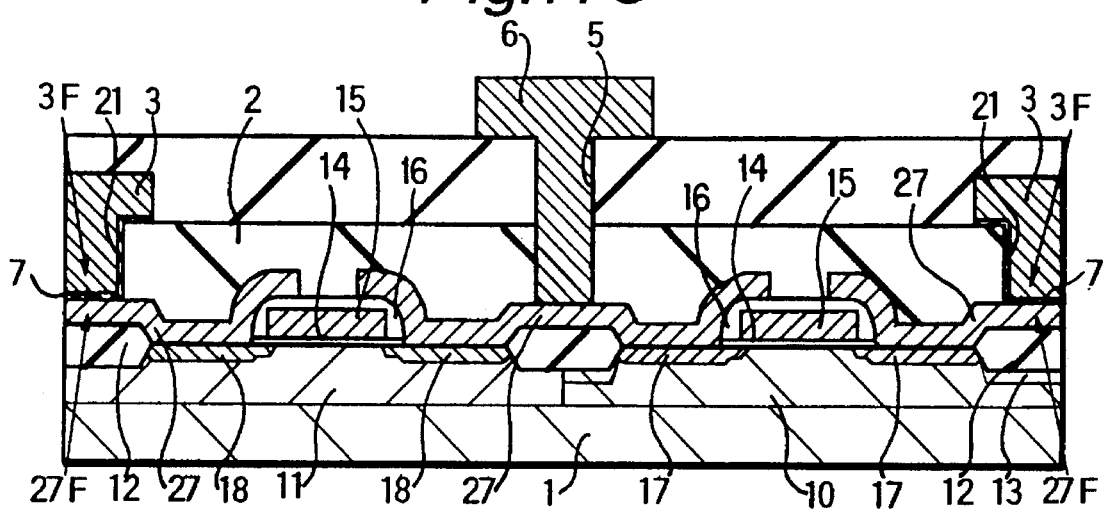

Finally, the inter-layer dielectric layer 4 and the through hole 5 are formed, and the metal interconnect 6 is formed as a second level metal interconnect layer, as is shown in FIG. 11G. The passivation film 9 (not shown) is formed on the metal interconnect 6.

The thus formed semiconductor device has two gate layers (i.e. the gate electrode 15 and the bottom electrode 27F) and two interconnect layers (i.e. the first level metal interconnect including the top electrode 3F and the second level metal interconnect). The bottom electrode 27F in the two gate layers and the top electrode 3F in the two interconnect layers constitute the antifuse element.

While the invention has been described with particular reference to the embodiments, it will be understood by those skilled in the art that various modifications may be made without departing from invention. For example, this invention is applicable to a semiconductor device having three or more interconnect layers. The invention is also applicable to a printed circuit board, or to a interconnect wiring technique. In either case, the same advantages are obtained by the effective method for manufacturing the antifuse element for a semiconductor device. Namely, (1) the reduced resistance in the filament without large variation because of the evenness of the surface of the bottom electrode, (2) improved reliability of the circuit operation and increased operation speed, and (3) ensured electrical connection and insulation with a low breakdown voltage for the antifuse material layer and a low operation voltage.

What is claimed is:

1. An antifuse element comprising a bottom electrode, a top electrode, and an antifuse material layer arranged between the bottom and top electrode, said antifuse material layer capable of being broken to provide an electrical connection between the bottom and top electrode, said antifuse material layer providing electrical insulation between the bottom and top electrode when not broken, at least an uppermost portion of the bottom electrode is made of metallic silicide whose metal component ratio is more than metallic silicide expressed as $MSi_2$.

2. An antifuse element according to claim 1, wherein said metallic silicide constituting at least the uppermost portion of the bottom electrode is formed with Si and at least one member selected from the group consisting of Ti, Ta, Nb, Zr, Y, Hf, Al, W, Mo, Cr, V, Mn, Fe, Co, Ni, Pd and Pt.

3. An antifuse element according to claim 2, wherein said metallic silicide constituting at least the uppermost portion of the bottom electrode is formed by silicidizing a metal layer at a temperature of 400°–700° C. after formation of the metal layer.

4. An antifuse element according to claim 2, wherein said metallic silicide constituting at least the uppermost portion of the bottom electrode is formed by sputtering.

5. An antifuse element according to claim 2, wherein said antifuse material layer is made of a single layer of silicon oxide, silicon nitride or tantalum oxide, or multiple layers with at least two members selected from silicon oxide, silicon nitride and tantalum oxide.

6. An antifuse element according to claim 2, wherein said bottom electrode is one of a single layer of metallic silicide, composite layers of a Si substrate and the metallic silicide formed thereon, and a deposited Si layer and the metallic silicide formed thereon.

7. An antifuse element according to claim 2, wherein said bottom electrode is formed on one of a dielectric layer and a field oxide.

8. An antifuse element according to claim 1, further comprising a dielectric layer formed between the bottom and top electrodes, and an antifuse connecting hole formed in the dielectric layer at a position corresponding to the bottom electrode.

9. An antifuse element according to claim 2, wherein s diameter of s crystal grain size of the metallic silicide for the bottom electrode is not more than 20 nm.

10. An antifuse element according to claim 2, wherein a center line average height, Ra, on a surface of the metallic silicide is not more than 2.0 nm.

11. An antifuse element according to claim 2, wherein a solid angle of a crystal protrusion on a surface of the metallic silicide is in a range of $1.8\pi$–$2.0\pi$ when a crystal grain size is in a range of 1 nm–1 µm.

12. An antifuse element according to claim 1, wherein at least the lowermost portion of the top electrode is made of metallic silicide whose metal component ratio is more than metallic silicide expressed as $MSi_2$.

13. An antifuse element according to claim 12, wherein at least the lowermost portion of the top electrode is made of titanium silicide containing at least 40% Ti.

14. An antifuse element according to claim 1, wherein at least the lowermost portion of the top electrode is made of titanium nitride containing at least 55% Ti.

15. An antifuse element according to claim 1, wherein the antifuse element forms a filament providing an electric connection when a negative voltage is applied to the bottom electrode while a positive voltage is applied to the top electrode, said filament containing metal from the metallic silicide of the bottom electrode.

16. A semiconductor device, comprising at least one antifuse element as recited in claim 1.

17. An antifuse element according to claim 5, wherein said antifuse material layer has a thickness of 5 to 20 nm.

* * * * *